United States Patent
Aoyama et al.

(10) Patent No.: US 8,383,948 B2
(45) Date of Patent: Feb. 26, 2013

(54) FLEX-RIGID WIRING BOARD AND METHOD FOR MANUFACTURING THE SAME

(75) Inventors: Masakazu Aoyama, Ogaki (JP); Teruyuki Ishihara, Ogaki (JP); Noboru Shibita, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 348 days.

(21) Appl. No.: 12/794,106

(22) Filed: Jun. 4, 2010

(65) Prior Publication Data

US 2011/0067904 A1 Mar. 24, 2011

Related U.S. Application Data

(60) Provisional application No. 61/243,576, filed on Sep. 18, 2009.

(51) Int. Cl.
*H05K 1/00* (2006.01)
(52) U.S. Cl. ........ 174/254; 174/255; 361/749; 361/750; 361/751; 29/830
(58) Field of Classification Search .................. None
See application file for complete search history.

(56) References Cited

U.S. PATENT DOCUMENTS

| | | | | |
|---|---|---|---|---|
| 5,484,647 A * | 1/1996 | Nakatani et al. | ............ | 428/209 |
| 5,652,042 A * | 7/1997 | Kawakita et al. | ............ | 428/209 |
| 6,518,515 B2 * | 2/2003 | Nishii et al. | ............ | 174/262 |
| 6,528,733 B2 * | 3/2003 | Takenaka et al. | ............ | 174/255 |
| 6,734,375 B2 * | 5/2004 | Kawakita et al. | ............ | 174/264 |
| 6,831,236 B2 * | 12/2004 | Higuchi et al. | ............ | 174/264 |
| 6,855,892 B2 * | 2/2005 | Komatsu et al. | ............ | 174/256 |
| 7,045,198 B2 * | 5/2006 | Nakagiri et al. | ............ | 428/209 |
| 7,548,430 B1 * | 6/2009 | Huemoeller et al. | ........ | 361/760 |
| 7,623,347 B2 * | 11/2009 | Matsui | ............ | 361/695 |
| 7,737,367 B2 * | 6/2010 | Koyama et al. | ............ | 174/264 |
| 2009/0086450 A1 | 4/2009 | Matsui | | |

FOREIGN PATENT DOCUMENTS

| | | |
|---|---|---|
| CN | 101176388 A | 5/2008 |
| CN | 101272660 A | 9/2008 |
| JP | 2006-186110 | 7/2006 |
| JP | 2006-210448 | 8/2006 |
| JP | 4021472 | 10/2007 |
| JP | 2008-21960 | 1/2008 |
| JP | 2008-211053 | 9/2008 |

* cited by examiner

*Primary Examiner* — Boris Chervinsky
(74) *Attorney, Agent, or Firm* — Oblon, Spivak, McClelland, Maier & Neustadt, L.L.P.

(57) ABSTRACT

A flex-rigid wiring board includes a flexible substrate having a first surface and a second surface on the opposite side of the first surface, a first conductive pattern formed on the first surface of the flexible substrate, a second conductive pattern formed on the second surface of the flexible substrate, and a conductor made of a conductive paste and formed in a first hole penetrating through the flexible substrate such that the first conductive pattern and the second conductive pattern are electrically connected to each other.

18 Claims, 26 Drawing Sheets

FLEX-RIGID WIRING BOARD AND METHOD FOR MANUFACTURING THE SAME

CROSS-REFERENCE TO RELATED APPLICATIONS

The present application claims the benefits of priority to U.S. Application No. 61/243,576, filed Sep. 18, 2009. The contents of that application are incorporated herein by reference in their entirety.

BACKGROUND OF THE INVENTION

1. Field of the Invention

The present invention relates to a flex-rigid wiring board and its manufacturing method.

2. Discussion of the Background

In Japanese Laid-Open Patent Publication Nos. 2006-186110, 2008-211053 and 2008-21960, a flexible wiring board having a shield layer is described. Also, in Japanese Laid-Open Patent Publication No. 2006-210448 and Japanese Patent No. 4021472, a flex-rigid wiring board is described in which a conductor in a flexible region and a conductor in a rigid region are connected to each other by plating. The contents of Japanese Patent Application Nos. 2006-186110, 2008-211053, 2008-21960 and 2006-210448, and Japanese Patent No. 4021472 are incorporated herein by reference in their entirety in the present application.

SUMMARY OF THE INVENTION

According to one aspect of the present invention, a flex-rigid wiring board includes a flexible substrate having a first surface and a second surface on the opposite side of the first surface, a first conductive pattern formed on the first surface of the flexible substrate, a second conductive pattern formed on the second surface of the flexible substrate, and a conductor made of a conductive paste and formed in a first hole penetrating through the flexible substrate such that the first conductive pattern and the second conductive pattern are electrically connected to each other.

According to another aspect of the present invention, a flex-rigid wiring board includes a flexible substrate having a first surface and a second surface on the opposite side of the first surface, a first conductive pattern formed on the first surface of the flexible substrate, a second conductive pattern formed on the second surface of the flexible substrate, an insulation layer formed on the second conductive pattern, a shield layer formed on the insulation layer, and a conductor made of a conductive paste and formed in a hole penetrating through the insulating layer, the second conductive pattern and the flexible substrate and reaching the first conductive pattern such that the first conductive pattern and the second conductive pattern are electrically connected to each other.

According to yet another aspect of the present invention, a method for manufacturing a flex-rigid wiring board includes providing a flexible substrate having a first surface and a second surface on the opposite side of the first surface, forming a first conductive pattern on the first surface of the flexible substrate, forming a second conductive pattern on the second surface of the flexible substrate, forming a first hole penetrating the second conductive pattern and the flexible substrate, and forming a conductor made of conductive paste in the first hole such that the first conductive pattern and the second conductive pattern are electrically connected to each other.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
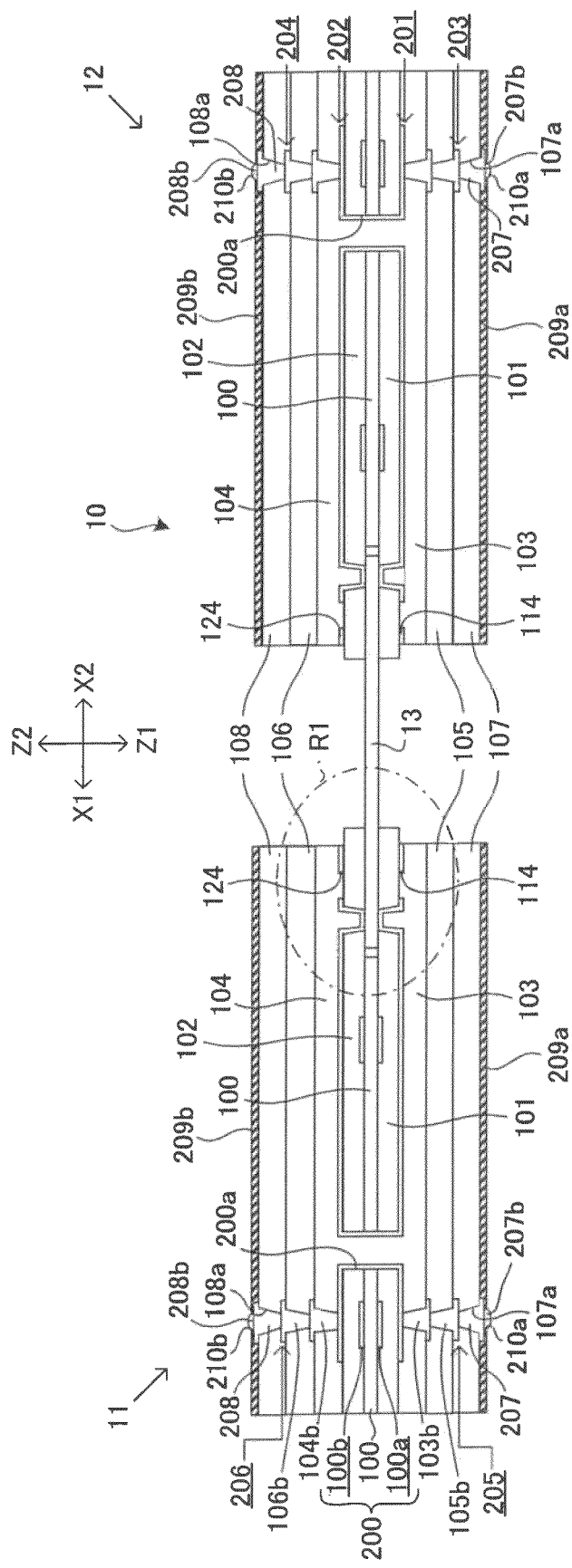
FIG. 1 is a cross-sectional view of a flex-rigid wiring board according to an embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board, corresponding to a direction along a normal line (or a direction of the thickness of a core substrate) to the main surfaces (upper and lower surfaces) of the wiring board. On the other hand, arrows (X1, X2) and (Y1, Y2) each indicate a direction perpendicular to a lamination direction (directions parallel to the main surfaces of the wiring board). The main surfaces of a wiring board are on the X-Y plane. Side surfaces of a wiring board are on the X-Z plane or the Y-Z plane.

In the present embodiment, two main surfaces of a wiring board are referred to as a first surface (a surface on the arrow-Z1 side) and a second surface (a surface on the arrow-Z2 side). In a lamination direction, the side closer to a core (substrate 200) is referred to as a lower layer, and the side farther from the core is referred to as an upper layer. A layer including a conductive pattern that functions as wiring is referred to as a wiring layer. The conductor formed in a through hole is referred to as a through-hole conductor. Also, a conductor formed in a via hole and electrically connecting an upper-layer wiring layer and a lower-layer wiring layer to each other is referred to as an interlayer connection conductor.

Figure 2:
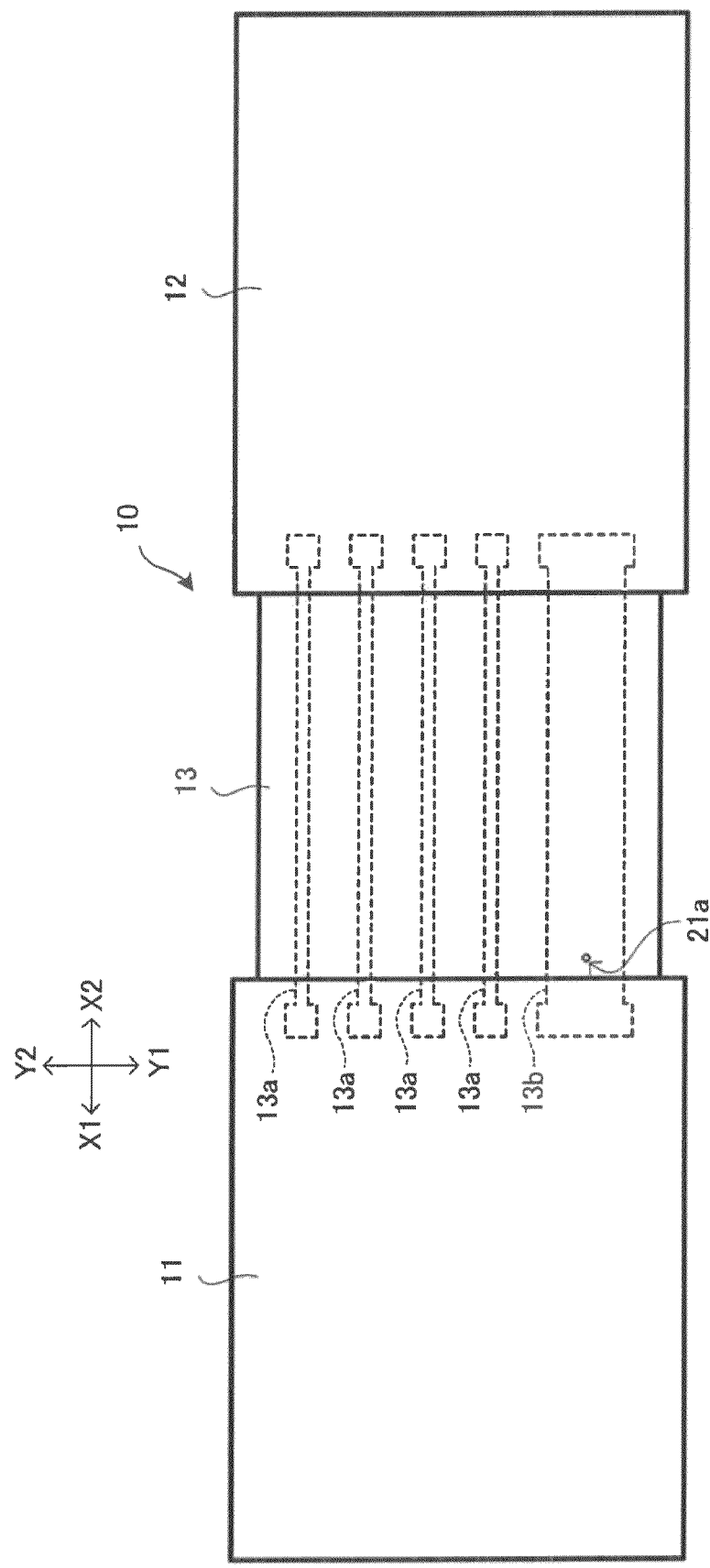
FIG. 2 is a plan view of FIG. 1.

As shown in FIGS. 1 and 2 (plan view of FIG. 1), flex-rigid wiring board 10 of the present embodiment has first rigid wiring board 11, second rigid wiring board 12 and flexible wiring board 13. First and second rigid wiring boards (11, 12) and flexible wiring board 13 are set apart side by side in a horizontal direction. Flexible wiring board 13 has signal line (13a) and GND (ground) line (13b) on each of the first surface and second surface. Signal line (13a) is electrically connected to signal lines of first rigid wiring board 11 and second rigid wiring board 12. GND line (13b) is electrically connected to GND lines of first rigid wiring board 11 and second rigid wiring board 12.

Figure 3:
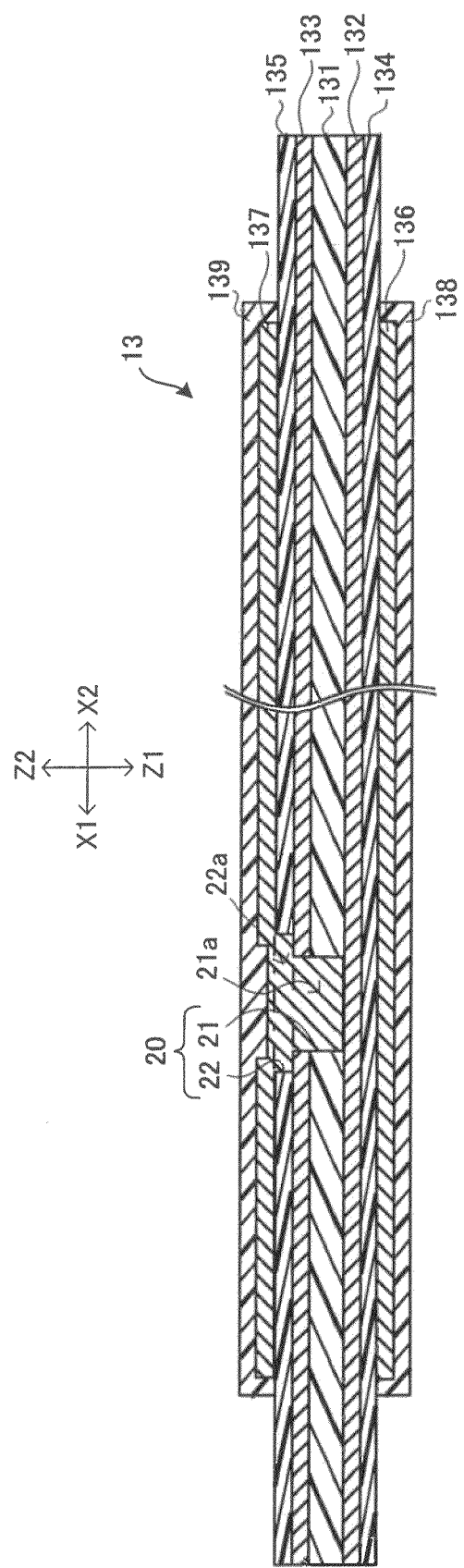
FIG. 3 is a cross-sectional view of a flexible wiring board according to the present embodiment.

As shown in FIG. 3, for example, flexible wiring board 13 has flexible substrate 131, conductive layers (132, 133), insulation layers (134, 135), shield layers (136, 137) and coverlays (138, 139).

Flexible substrate 131 is made of insulative polyimide or liquid crystal polymer, for example. The thickness of flexible substrate 131 is set at 20-50 μm, for example, preferably at approximately 30 μm.

Conductive layer 132 (first conductive pattern) and conductive layer 133 (second conductive pattern) include conductive patterns made of copper, for example. The thickness of conductive layers (132, 133) is set at approximately 5-15 μm, for example. Conductive layer 132 is formed on the first surface of flexible substrate 131, and conductive layer 133 is formed on the second surface of flexible substrate 131. Conductive layers (132, 133) form striped wirings, for example, which connect first rigid wiring board 11 and second rigid wiring board 12 to each other.

Insulation layers (134, 135) are made of polyimide, for example. The thickness of insulation layers (134, 135) is set approximately at 5-15 μm, for example. Insulation layer 134 is formed on conductive layer 132, and insulation layer 135 is formed on conductive layer 133. Insulation layers (134, 135) insulate conductive layers (132, 133) from the outside.

In insulation layer 135 and conductive layer 133 and flexible substrate 131, hole 20 is formed to penetrate them and to reach conductive layer 132. Hole 20 is made up of first hole 21 and second hole 22. First hole 21 is formed in conductive layer 133 and flexible substrate 131. One end (on the second-surface side) of first hole 21 is open, and the other end (on the first-surface side) of first hole 21 is blocked by conductive layer 132. Second hole 22 is formed in insulation layer 135.

Figure 4A:
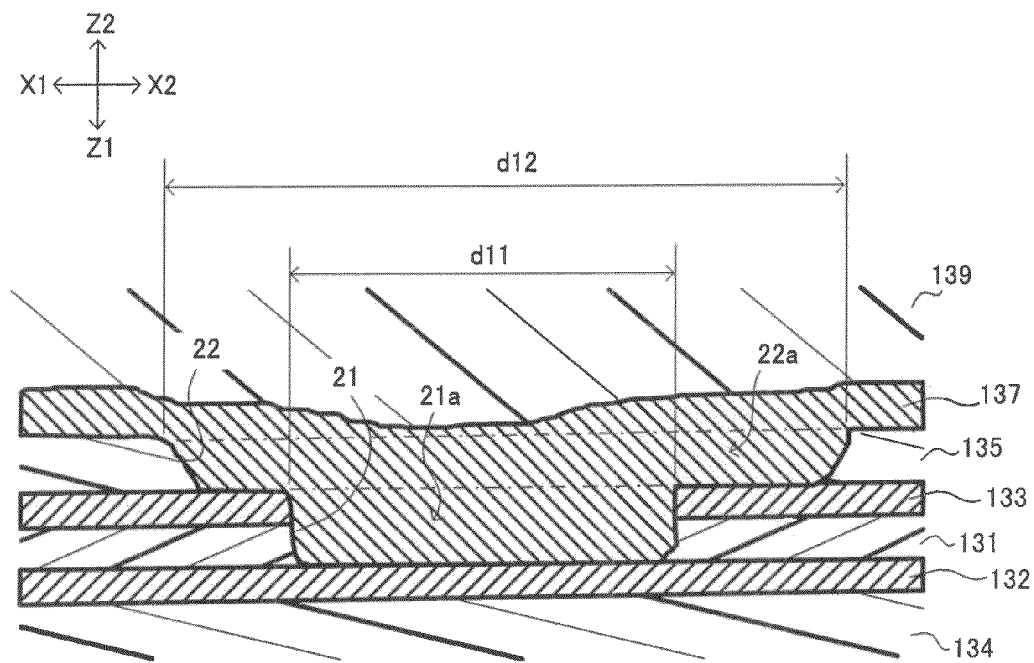
FIG. 4A is a cross-sectional view showing a conductive-pattern connection section in the flexible wiring board.
Figure 4B:
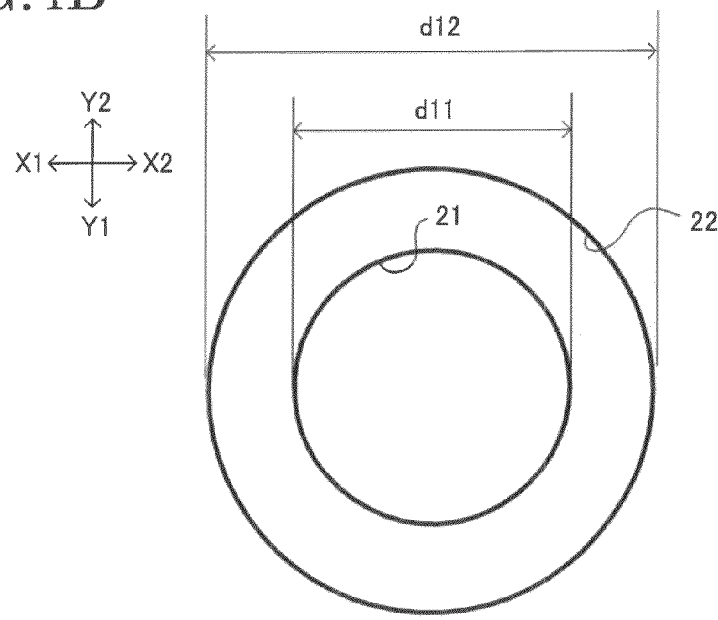
FIG. 4B is a plan view showing the conductive-pattern connection section in the flexible wiring board.

As shown in FIG. 4A, diameter (d12) of second hole 22 is greater than diameter (d11) of first hole 21. Second hole 22 is connected to first hole 21. The opening shape of first hole 21 and second hole 22 is circular, for example, as shown in FIG. 4B. However, the opening shape of first hole 21 and second hole 22 is not limited to a circle, and it may have any shape other than a circle.

Conductor (21a) is filled in first hole 21, and conductor (22a) is filled in second hole 22. Conductive layer 132 and conductive layer 133 are electrically connected to each other by conductor (21a). As shown in FIG. 2 previously, in the present embodiment, signal line (13a) and GND line (13b) are formed on the first and second surfaces of flexible substrate 131. Signal line (13a) and GND line (13b) are conductive patterns included in conductive layers (132, 133). Conductive layers (132, 133) connected by conductor (21a) are GND lines (13b), for example. On the other hand, in signal line (13a), hole 20 and conductor (21a) or the like are not formed. However, the present embodiment is not limited to such, and any conductive pattern may be connected by conductor (21a) according to requirements. Conductors (21a, 22a) are formed to be contiguous to shield layer 137 formed on insulation layer 135. Namely, conductors (21a, 22a) are made of the same material as that of shield layer 137, and are electrically connected to shield layer 137. Since conductors (21a, 22a) are formed to be contiguous to shield layer 137, stable GND connection may be achieved. Also, conductors (21a, 22a) and shield layer 137 may be formed at the same time.

Shield layers (136, 137) are made of conductive paste. Conductive paste contains fine silver particles, for example. Conductive paste is preferred to contain at least one kind selected from among silver, gold, copper and carbon. Since silver has high electrical conductivity, it is especially effective in reducing noise. "Conductive paste" indicates paste in which fine conductive particles are mixed in a viscous binder with a predetermined concentration. The binder is a resin or the like which binds particles. Conductive paste is distinguished from a conductor formed with plating (plated film). However, the material for conductive paste is not limited to silver, and any other material may be used. Shield layer 136 is formed on insulation layer 134, and shield layer 137 is formed on insulation layer 135. Shield layers (136, 137) shield electromagnetic noise from the outside to conductive layers (132, 133), and shield electromagnetic noise from conductive layers (132, 133) to the outside.

Coverlays (138, 139) (upper-layer insulation layers) are made of polyimide, for example. The thickness of coverlays (138, 139) is set approximately at 5-15 µm, for example. Coverlay 138 is formed on insulation layer 134, and coverlay 139 is formed on insulation layer 135. Coverlay 138 coats shield layer 136, and coverlay 139 coats shield layer 137. Coverlays (138, 139) protect and insulate entire flexible wiring board 13 from the outside.

As shown in FIG. 1, both ends of flexible wiring board 13 are connected respectively to first rigid wiring board 11 and second rigid wiring board 12. First rigid wiring board 11 and second rigid wiring board 12 are connected to each other by means of flexible wiring board 13. Namely, first rigid wiring board 11 and second rigid wiring board 12 are positioned opposite each other while sandwiching flexible wiring board 13.

Figure 5:
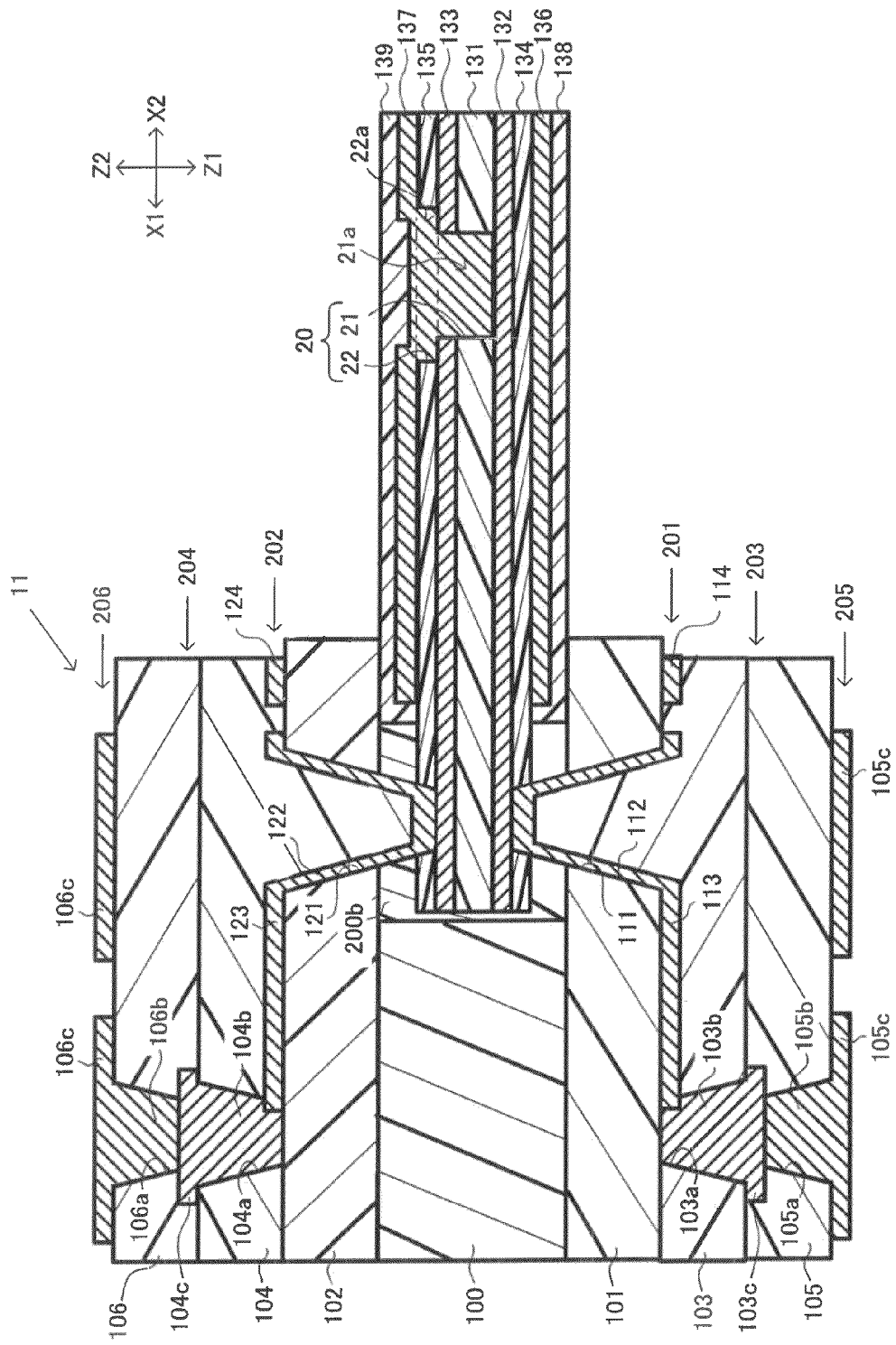
FIG. 5 is a cross-sectional view showing a connection section between a rigid wiring board and a flexible wiring board.

FIG. 5 shows a magnified view of region (R1) in FIG. 1 (the connected section of first rigid wiring board 11 and flexible wiring board 13). The structure of the connected section between second rigid wiring board 12 and flexible wiring board 13 is the same as the structure of the connected section between first rigid wiring board 11 and flexible wiring board 13. Therefore, only the structure of the connected section between first rigid wiring board 11 and flexible wiring board 13 is described in detail, and the detailed description of the other connected section is omitted here.

Resin (200b) is filled in the space partitioned by flexible wiring board 13, rigid substrate 100, and insulation layers (101, 102) (the clearance among such members). Resin (200b) flows out from insulation layers (101, 102), for example, and is cured to become integrated with insulation layers (101, 102). Insulation layers (101, 102) sandwich the end portion of flexible wiring board 13 and are polymerized with coverlays (138, 139).

Via hole 111 is formed in insulation layer 101 and reaches conductive layer 132. Via hole 121 is formed in insulation layer 102, and reaches conductive layer 133. Via holes (111, 121) taper. Conductor 112 is formed on the wall surface of via hole 111, and conductor 122 is formed on the wall surface of via hole 121. Conductors (112, 122) are made of copper-plated film, for example. On the inner side of conductors (112, 122), resin from upper-layer insulation layers (103, 104) is filled.

Extended pattern 113 contiguous to conductor 112 is formed on insulation layer 101. Extended pattern 123 contiguous to conductor 122 is formed on insulation layer 102. Extended patterns (113, 123) are made of copper-plated film, for example.

Furthermore, conductive patterns (114, 124), insulated from others, are positioned close to the side of flexible wiring board 13 rather than close to the boundary of flexible wiring board 13 and rigid substrate 100. Conductive patterns (114, 124) radiate heat generated in first rigid wiring board 11.

In flex-rigid wiring board 10 of the present embodiment, first and second rigid wiring boards (11, 12) and flexible wiring board 13 are electrically connected without using connectors. Therefore, an impact from being dropped or the like will not result in a faulty connection due to disconnected connectors.

By means of flexible wiring board 13 entered (embedded) into each of first and second rigid wiring boards (11, 12), first rigid wiring board 11 and second rigid wiring board 12 are electrically connected to each other in the areas where flexible wiring board 13 is entered (embedded areas). Accordingly, the connected portions are bonded and reinforced by first and second rigid wiring boards (11, 12).

First and second rigid wiring boards (11, 12) are built-up multilayer printed wiring boards. The structure of first rigid wiring board 11 is the same as that of second rigid wiring board 12. Therefore, only the structure of first rigid wiring board 11 is described in detail, and the detailed description of the structure of second rigid wiring board 12 is omitted here.

As shown in FIG. 1, first rigid wiring board 11 has substrate 200, insulation layers (101-108), wiring layers (201, 206) and conductors (207, 208). Insulation layers (103-108) work as interlayer insulation layers. Insulation layers (103-108) are made of cured prepreg, for example. As for prepreg, for example, the following is used: base material such as glass fiber or aramid fiber impregnated with resin such as epoxy resin, polyester resin, bismaleimide triazine resin (BT resin), imide resin (polyimide), phenol resin, or allyl polyphenylene ether resin (A-PPE resin).

Substrate 200 corresponds to a core substrate. Substrate 200 has rigid substrate 100 and conductive patterns (100a, 100b).

Rigid substrate 100 is made of epoxy resin, for example. Epoxy resin is preferred to contain reinforcing material such as glass fiber or aramid fiber impregnated with resin. The reinforcing material is a material with a smaller thermal expansion coefficient than the main material (epoxy resin). The thickness of rigid substrate 100 is set at 50-105 cµm, for example, preferably at approximately 100 µm. The thickness of rigid substrate 100 is substantially the same as the thickness of flexible wiring board 13.

Conductive pattern (100a) is formed on the first surface of rigid substrate 100, and conductive pattern (100b) is formed on the second surface of rigid substrate 100. Conductive patterns (100a, 100b) are electrically connected to upper-layer conductors at predetermined spots. Conductive patterns (100a, 100b) are made of copper, for example.

Insulation layer 101 is formed on the first surface of substrate 200, and insulation layer 102 is formed on the second surface of substrate 200. Insulation layers (101, 102) are made of cured prepreg. The thickness of insulation layers (101, 102) is set at 50-100 µm, for example, preferably at approximately 50 µm.

Wiring layer 201 is formed on insulation layer 101, and wiring layer 202 is formed on insulation layer 102. As shown in FIG. 1, through hole (penetrating hole) (200a) is formed in rigid substrate 100 and insulation layers (101, 102). Then, a through-hole conductor formed in through hole (200a) electrically connects wiring layer 201 and wiring layer 202 to each other. As shown in FIG. 5, extended pattern 113 and conductive pattern 114 are included in wiring layer 201, and extended pattern 123 and conductive pattern 124 are included in wiring layer 202.

Insulation layer 103 is formed as an upper layer of insulation layer 101, and insulation layer 104 is formed as an upper layer of insulation layer 102. Wiring layer 203 is formed on insulation layer 103, and wiring layer 204 is formed on insulation layer 104. Via hole (103a) is formed in insulation layer 103, and via hole (104a) is formed in insulation layer 104. Interlayer connection conductor (103b) is filled in via hole (103a), and interlayer connection conductor (104b) is filled in via hole (104a). Interlayer connection conductors (103b, 104b) are made of copper-plated film, for example.

Wiring layer 203 is formed on insulation layer 103, and wiring layer 204 is formed on insulation layer 104. Conductive pattern (103c) is included in wiring layer 203, and conductive pattern (104c) is included in wiring layer 204. Interlayer connection conductor (103b) connects extended pattern 113 and conductive pattern (103c), and interlayer connection conductor (104b) connects extended pattern 123 and conductive pattern (104c).

Insulation layer 105 is formed as an upper layer of insulation layer 103, and insulation layer 106 is formed as an upper layer of insulation layer 104. Wiring layer 205 is formed on insulation layer 105, and wiring layer 206 is formed on insulation layer 106. Via hole (105a) is formed in insulation layer 105, and via hole (106a) is formed in insulation layer 106. Interlayer connection conductor (105b) is filled in via hole (105a), and interlayer connection conductor (106b) is filled in via hole (106a). Interlayer connection conductors (105b, 106b) are made of copper-plated film, for example.

Wiring layer 205 is formed on insulation layer 105, and wiring layer 206 is formed on insulation layer 106. Conductive pattern (105c) is included in wiring layer 205, and conductive pattern (106c) is included in wiring layer 206. Interlayer connection conductor (105b) connects conductive pattern (103c) and conductive pattern (105c), and interlayer connection conductor (106b) connects conductive pattern (104c) and conductive pattern (106c).

Insulation layer 107 is formed as an upper layer of insulation layer 105, and insulation layer 108 is formed as an upper layer of insulation layer 106. Via hole (107a) is formed in insulation layer 107, and via hole (108a) is formed in insulation layer 108. Conductor 207 is formed in via hole (107a), and conductor 208 is formed in via hole (108a). Solder-resist layer (209a) is formed on insulation layer 107, and solder-resist layer (209b) is formed on insulation layer 108. Solder-resist layers (209a, 209b) are each made of resins such as photosensitive resin using acrylic epoxy resin, thermosetting resin mainly containing epoxy resin or UV-setting resin, for example.

Opening (210a) is formed in solder-resist layer (209a), and opening (210b) is formed in solder-resist layer (209b). External connection terminal (207b) is formed in opening (210a), and external connection terminal (208b) is formed in opening (210b). External connection terminal (207b) is formed on conductor 207, and external connection terminal (208b) is formed on conductor 208. External connection terminals (207b, 208b) are used for electrical connection with other wiring boards or electronic components or the like. Flex-rigid wiring board 10 may be used as a circuit board for cell phones or the like by being mounted onto other wiring boards at one or both of its sides.

Wiring layers (201-206) and conductors (207, 208) may be formed with metals other than copper. As material for insulation layers (101-108), liquid or film type thermosetting resin or thermoplastic resin, or RCF (resin coated copper foil) may also be used.

In the following, a method for manufacturing flex-rigid wiring board 10 is described.

Flexible wiring board 13 is prepared (manufactured) by the followings steps, for example.

Figure 6:
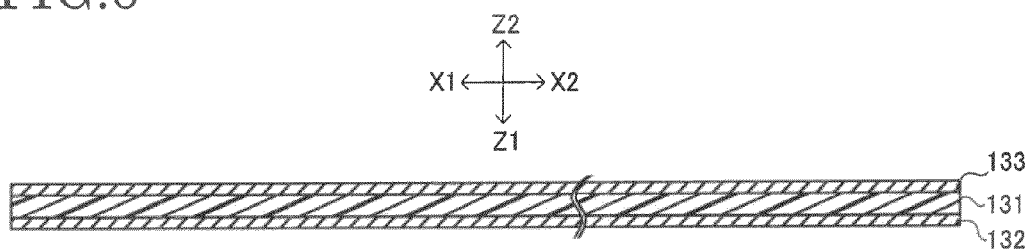
FIG. 6 is a view to illustrate a first step for manufacturing a flexible wiring board.
Figure 7:
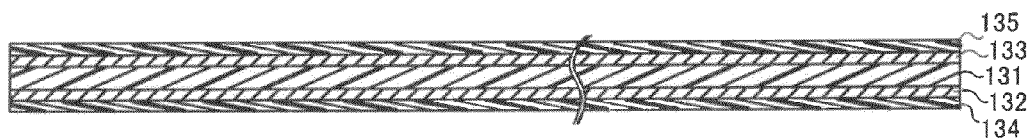
FIG. 7 is a view to illustrate a second step for manufacturing a flexible wiring board.

As shown in FIG. 6, for example, patterned conductive layers (132, 133) are formed on both surfaces of flexible substrate 131 made of polyimide. Conductive patterns may be formed by etching conductors at predetermined spots after forming conductive films (such as copper foils). Alternatively, conductive patterns may also be formed by growing plating in areas where plating resist patterns are not formed. Next, as shown in FIG. 7, for example, insulation layer 134 is formed on the first surface of conductive layer 132, and forms insulation layer 135 on the second surface of conductive layer 133.

Figure 8A:
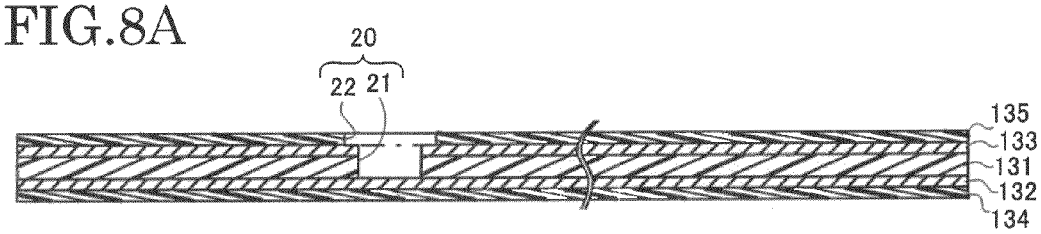
FIG. 8A is a view to illustrate a third step for manufacturing a flexible wiring board.
Figure 8B:
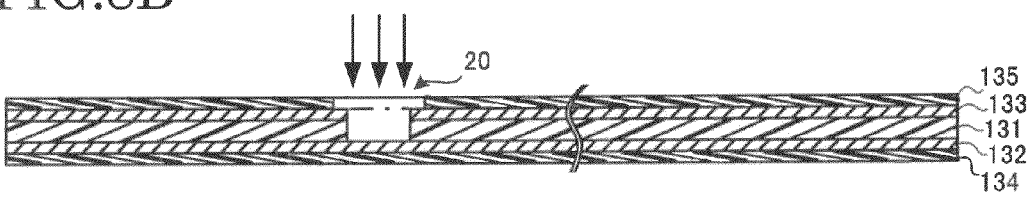
FIG. 8B is a view to illustrate a fourth step for manufacturing a flexible wiring board.

Next, as shown in FIG. 8A, for example, by using a laser, second hole 22 is formed in insulation layer 135, and first hole 21 is formed in conductive layer 133 and flexible substrate 131. By doing so, hole 20 is formed. Then, as shown in FIG. 8B, for example, hole 20 is desmeared using chemical agents, plasma, or ultraviolet rays or the like.

Next, shield layers (136, 137) and others are formed by screen printing, for example.

Figure 9:
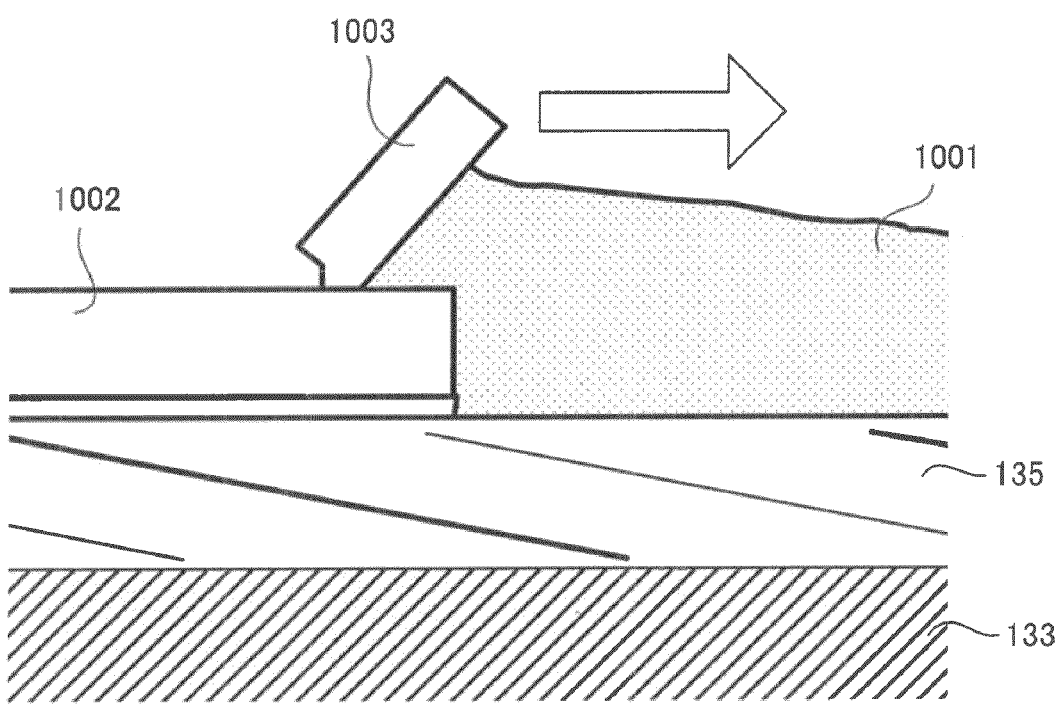
FIG. 9 is a view to illustrate a fifth step for manufacturing a flexible wiring board.

Specifically, as shown in FIG. 9, for example, metal mask 1002 is placed on insulation layer 135 (or 134). At that time, a predetermined clearance is arranged between metal mask 1002 and insulation layer 135 (or 134). However, such a process is not always required, and metal mask 1002 may make direct contact with insulation layer 135 (or 134).

Next, using squeegee 1003, conductive paste 1001 is applied on insulation layer 135 (or 134) while conductive paste 1001 is filled in hole 20. During that time, since the end surface of first hole 21 on the first-surface side is blocked by conductive layer 132, conductive paste 1001 is surely filled in hole 20. Also, since diameter (d12) of second hole 22 is greater than diameter (d11) of first hole 21, voids may be suppressed from occurring when filling conductive paste 1001. The "diameter" of a hole includes the opening width of a hole whose opening has a shape other than a circle. In a shape other than a circle, $\sqrt{(2 \times \text{cross section}/\pi)}$ may be considered as a diameter.

Figure 10:
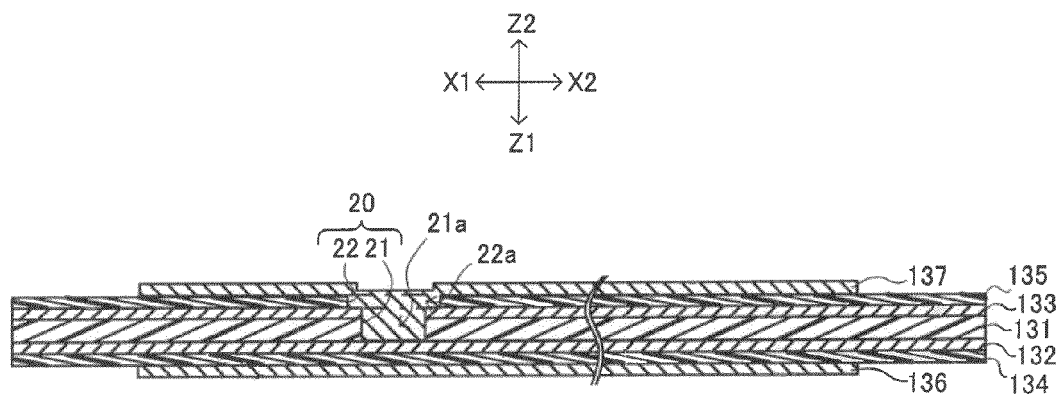
FIG. 10 is a view to illustrate a sixth step for manufacturing a flexible wiring board.

After that, by curing the conductive paste, shield layers (136, 137) and conductors (21a, 22a) are formed as shown in FIG. 10. Such layers and conductors may be formed on both surfaces simultaneously, or on one side at a time.

Figure 11:
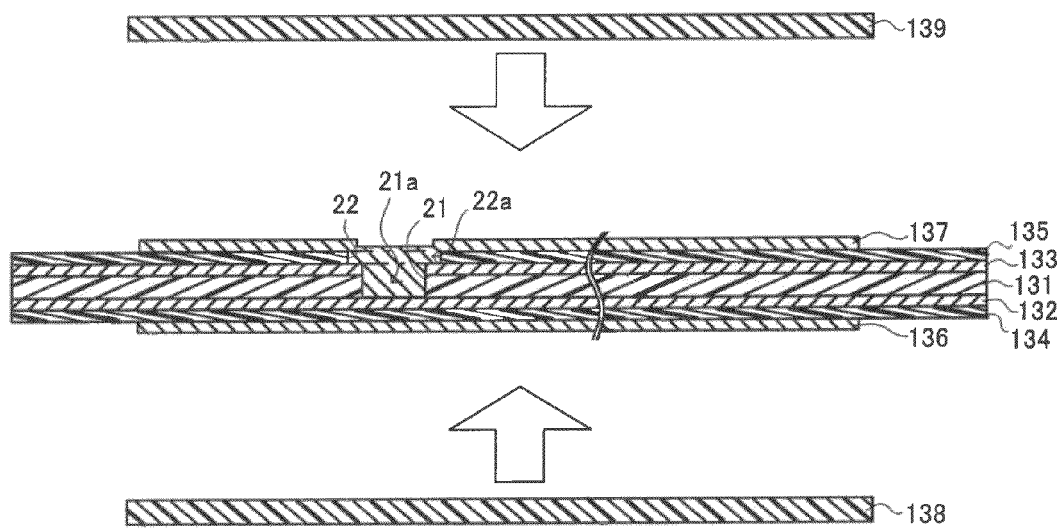
FIG. 11 is a view to illustrate a seventh step for manufacturing a flexible wiring board.

Next, as shown in FIG. 11, coverlay 138 is formed on the first surface of shield layer 136, and coverlay 139 is formed on the second surface of shield layer 137. By doing so, shield layer 136 is coated with coverlay 138, and shield layer 137 is coated with coverlay 139.

By cutting the wiring board manufactured as above to a predetermined size and shape using a laser, for example, flexible wiring board 13 (FIG. 3) is completed.

Figure 12:
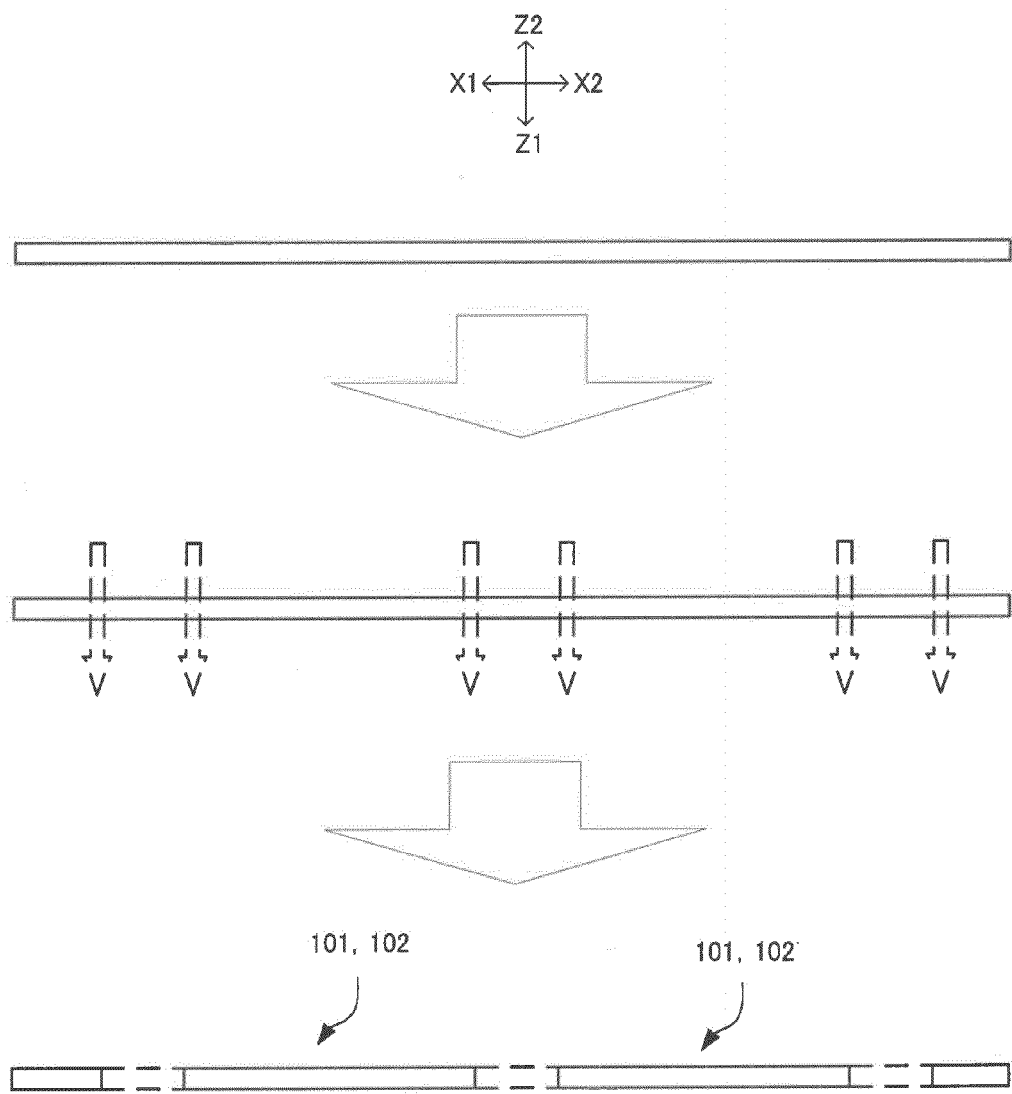
FIG. 12 is a view to illustrate a step for preparing an upper-layer insulation layer of a core substrate.

As shown in FIG. 12, for example, insulation layers (101, 102) are prepared by cutting with a laser, for example, a material that can be used for multiple products.

Figure 13:
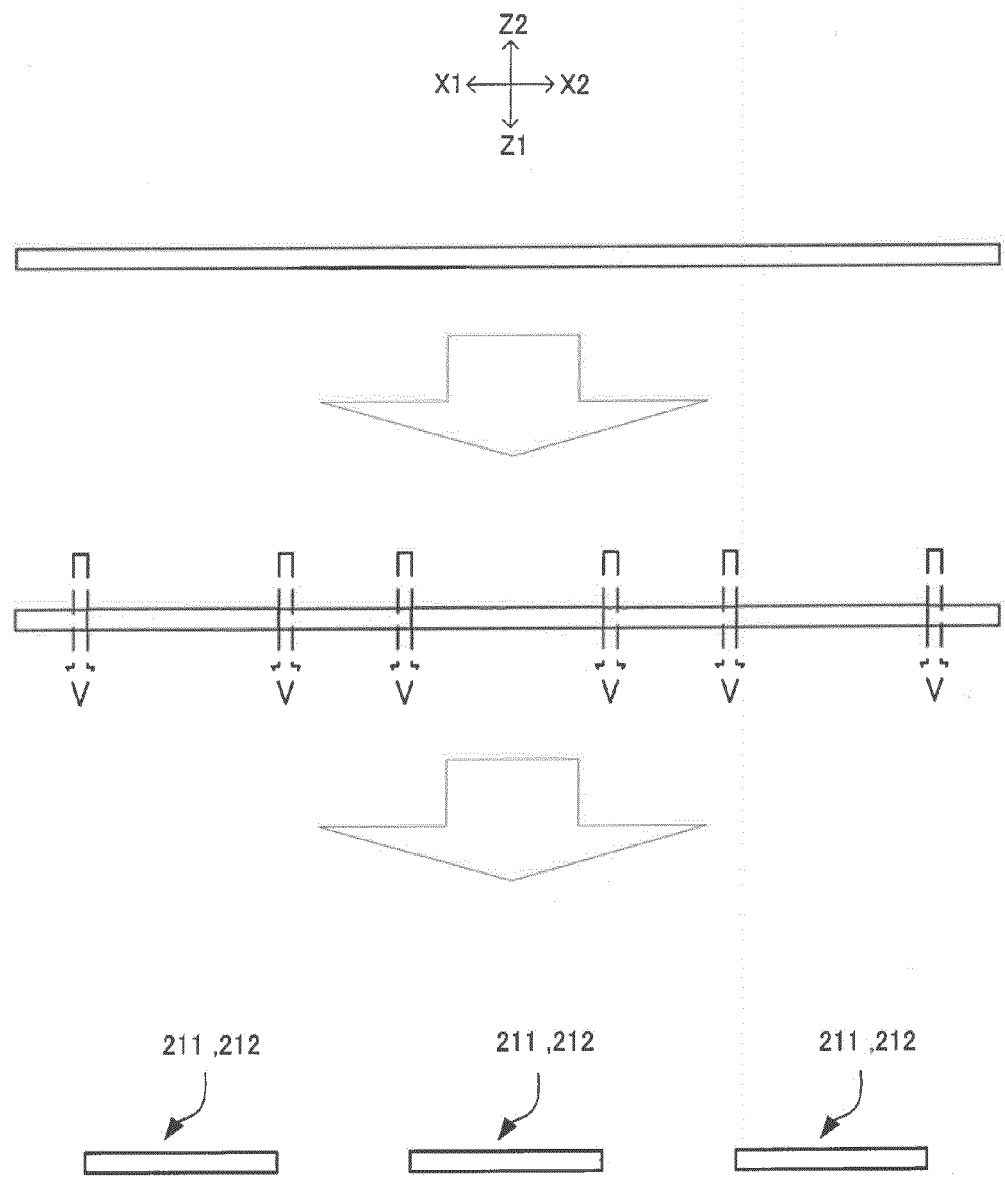
FIG. 13 is a view to illustrate a step for preparing a first separator.

As shown in FIG. 13, for example, first separators (211, 212) are prepared by cutting with a laser, for example, a material that can be used for multiple products. First separators (211, 212) are made of polyimide film, for example.

Figure 14:
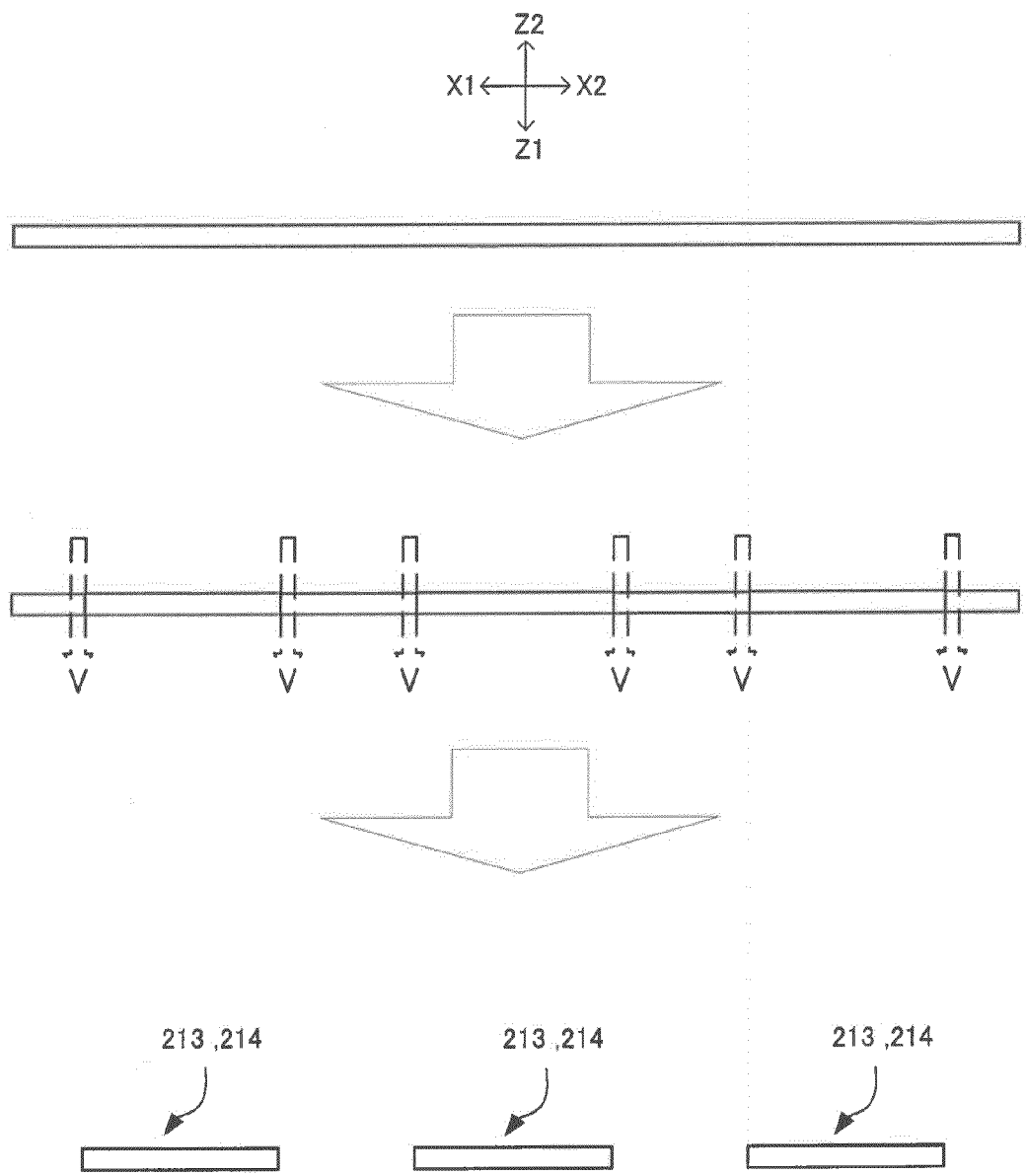
FIG. 14 is a view to illustrate a step for preparing a second separator.

As shown in FIG. 14, for example, second separators (213, 214) are prepared by cutting with a laser, for example, a material that can be used for multiple products. Second separators (213, 214) are made of an adhesive sheet, for example.

Substrate 200 is prepared (manufactured) by the following steps, for example.

Figure 15A:
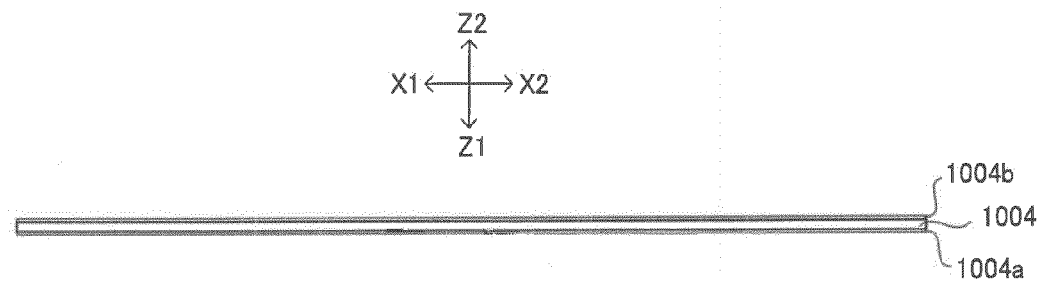
FIG. 15A is a view to illustrate a first step for manufacturing a core substrate.

As shown in FIG. 15A, for example, a double-sided copper-clad laminate is prepared. The double-sided copper-clad laminate has conductive film (1004a) on the first surface of rigid substrate 1004, and conductive film (1004b) on the second surface of rigid substrate 1004. Rigid substrate 1004 is made of epoxy resin, for example. Conductive films (1004a, 1004b) are copper foil, for example.

Figure 15B:
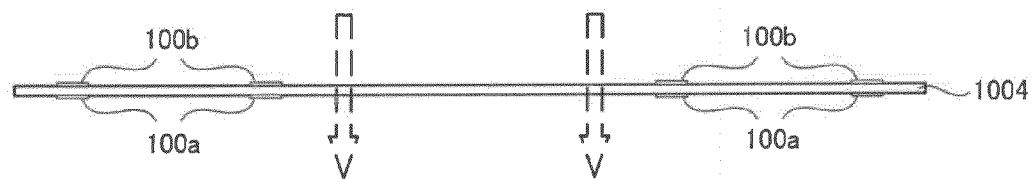
FIG. 15B is a view to illustrate a second step for manufacturing a core substrate.

Next, as shown in FIG. 15B, for example, conductive films (1004a, 1004b) are patterned by a predetermined lithographic procedure (preliminary treatment, laminating, exposure, development, etching, film removal, inner-layer inspection and so forth), for example. Accordingly, conductive patterns (100a, 100b) are formed.

Figure 15C:
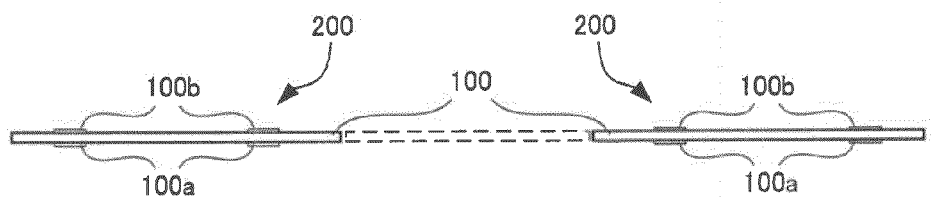
FIG. 15C is a view to illustrate a third step for manufacturing a core substrate.

Next, as shown in FIG. 15C, for example, substrates 200 (core substrates) are obtained by cutting the laminate using a laser, for example. After that, the surfaces are roughened, if required. Substrates 200 are obtained for first and second rigid wiring boards (11, 12).

Flex-rigid wiring board 10 is manufactured through the following steps, for example, by using substrates 200, flexible wiring board 13, insulation layers (101, 102), first separators (211, 212) and second separators (213, 214).

Figure 16:
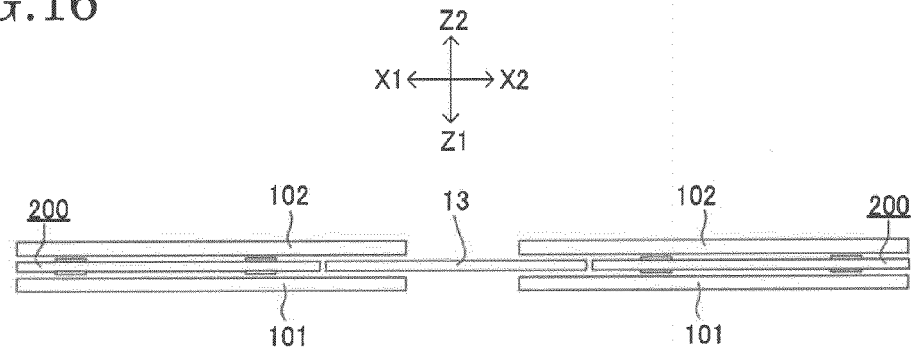
FIG. 16 is a view to illustrate a first step for bonding a core substrate and a flexible wiring board.

Substrates 200, flexible wiring board 13 and insulation layers (101, 102) are aligned and positioned as shown in FIG. 16, for example. Flexible wiring board 13 is set side by side with substrates 200.

Figure 17:
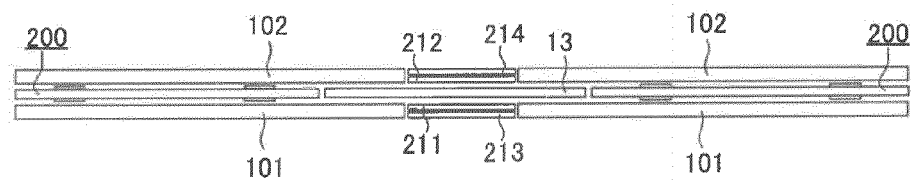
FIG. 17 is a view to illustrate a second step for bonding a core substrate and a flexible wiring board.

Next, as shown in FIG. 17, for example, first separator 211 is positioned on the first-surface side of flexible wiring board 13, and first separator 212 is positioned on the second-surface side of flexible wiring board 13. Moreover, second separator 213 is positioned on the first-surface side of first separator 211, and second separator 214 is positioned on the second-surface side of first separator 212.

Figure 18:
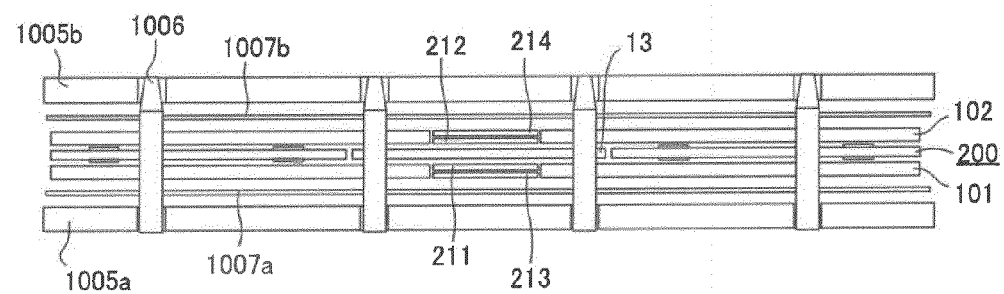
FIG. 18 is a view to illustrate a third step for bonding a core substrate and a flexible wiring board.

Next, as shown in FIG. 18, for example, the above aligned members are sandwiched with pressing devices (1005a, 1005b) and thermal pressing is conducted for a few seconds, for example. At that time, devices (1005a, 1005b) are aligned using pins 1006. Accordingly, pressure is added substantially perpendicular to the main surfaces. Here, to prevent devices (1005a, 1005b) from being adhered to the members during the pressing and being unable to be separated from the members, films (1007a, 1007b) are inserted between devices (1005a, 1005b) and the members before the pressing. Films (1007a, 1007b) are made of PET (PolyEthylene Terephthalate), for example.

Figure 19:
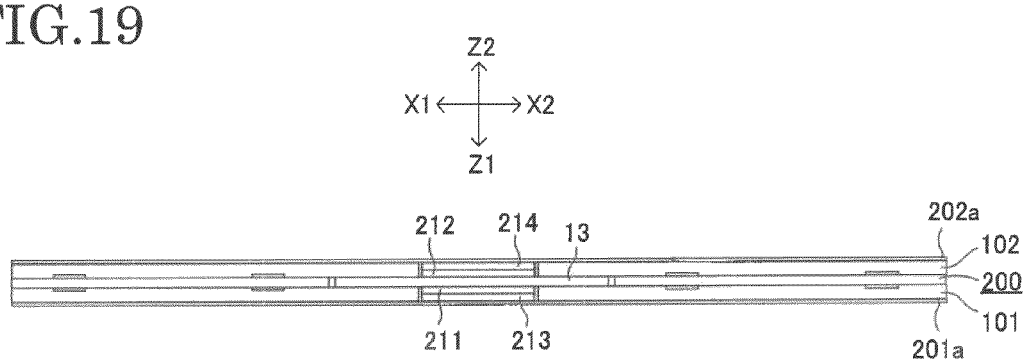
FIG. 19 is a view to illustrate a fourth step for bonding a core substrate and a flexible wiring board.

After the thermal pressing, conductive films (201a, 202a) made of copper are positioned on the outer sides of the members and pressurizes them as shown in FIG. 19, for example. Such pressurizing is conducted using a hydraulic pressing apparatus, for example, under the conditions of temperature 200° C., pressure 40 kgf and pressing time three hours. In doing so, resin (200b) (FIG. 5) is squeezed out from the prepreg that forms insulation layers (101, 102), and resin (200b) is filled in the clearance between rigid substrate 100 and flexible wiring board 13. After that, by adding heat, for example, insulation layers (101, 102) and resin (200b) are integrated, while insulation layers (101, 102) and coverlays (138, 139) are polymerized (see FIG. 5).

Figure 20:
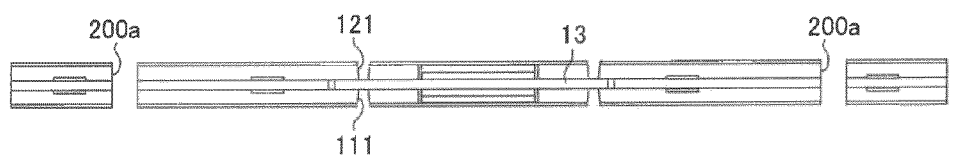
FIG. 20 is a view to illustrate a fifth step for bonding a core substrate and a flexible wiring board.

Next, as shown in FIG. 20, via holes (111, 121) and through hole (200a) are formed by irradiating a $CO_2$ laser, for example. Then, desmearing and soft etching are conducted.

Figure 21:
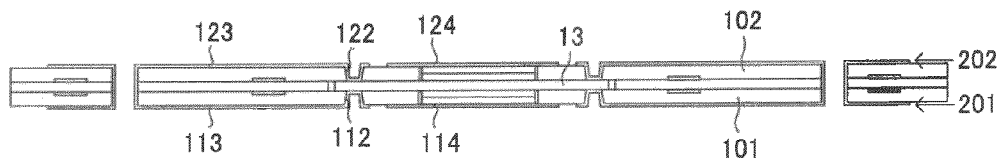
FIG. 21 is a view to illustrate a sixth step for bonding a core substrate and a flexible wiring board.

Then, PN plating (such as chemical copper plating and copper electroplating) is conducted. Next, as shown in FIG. 21, for example, conductive films (201a, 202a) are patterned by a predetermined lithographic process (preliminary treatment, laminating, exposure, development, etching, film removal, inner-layer inspection and so forth). Accordingly, wiring layers (201, 202) are formed. Conductor 112, extended pattern 113, and conductive pattern 114 are formed on the first surface of insulation layer 101. Conductor 122, extended pattern 123 and conductive pattern 124 are formed on the second surface of insulation layer 102. Then, the surfaces are roughened, if required.

Figure 22:
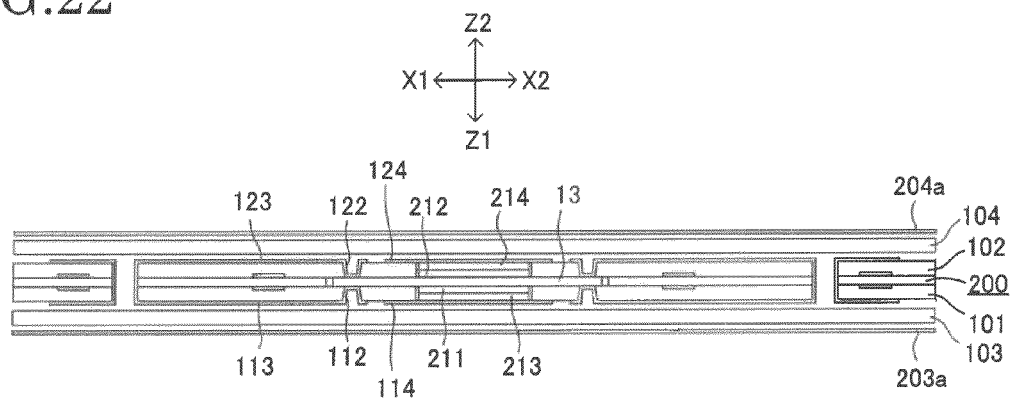
FIG. 22 is a view to illustrate a first step for forming an upper-layer wiring layer.
Figure 23:
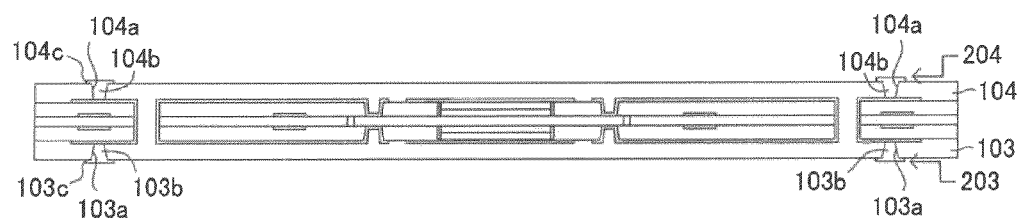
FIG. 23 is a view to illustrate a second step for forming an upper-layer wiring layer.

Next, as shown in FIG. 22, for example, insulation layer 103 is positioned on the first-surface side of the wiring board, and positions insulation layer 104 on the second-surface side of the wiring board. In addition, conductive film (203a) is positioned on the first-surface side of insulation layer 103, and conductive film (204a) is positioned on the second-surface side of insulation layer 104. Then, after conducting pressurizing, boring, desmearing, PN plating (such as chemical copper plating and copper electroplating) and a lithographic process, wiring layers (203, 204) are formed as shown in FIG. 23, for example. Accordingly, via hole (103a), interlayer connection conductor (103b) and conductive pattern (103c) are formed on the first surface of insulation layer 103, and via hole (104a), interlayer connection conductor (104b) and conductive pattern (104c) are formed on the second surface of insulation layer 104. After that, the surfaces are roughened, if required. Then, upper-layer insulation layers (105, 106) are formed, and wiring layers (205, 206) are formed through the same procedures. Accordingly, via hole (105a), interlayer connection conductor (105b) and conductive pattern (105c) are formed on the first surface of insulation layer 105, and via hole (106a), interlayer connection conductor (106b) and conductive pattern (106c) are formed on the second surface of insulation layer 106.

Figure 24:
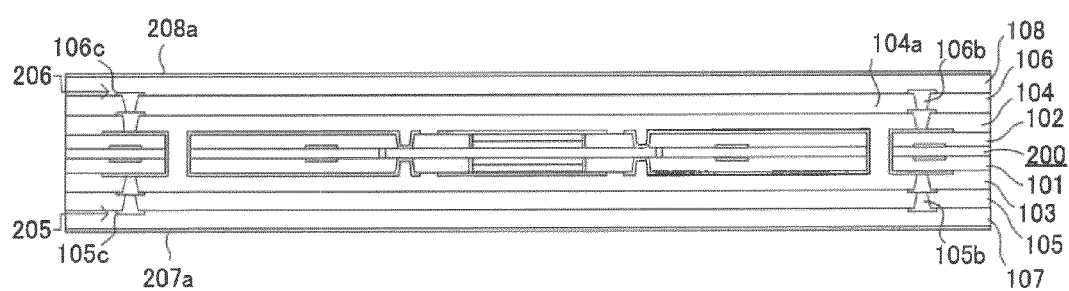
FIG. 24 is a view to illustrate a third step for forming an upper-layer wiring layer.

Next, as shown in FIG. 24, for example, insulation layer 107 is positioned on the first-surface side of the wiring board, and positions insulation layer 108 on the second-surface side of the wiring board. Furthermore, conductive film (207a) is positioned on the first-surface side of insulation layer 107, and conductive film (208a) is positioned on the second-surface side of insulation layer 108. Then, pressurizing is conducted.

Figure 25:
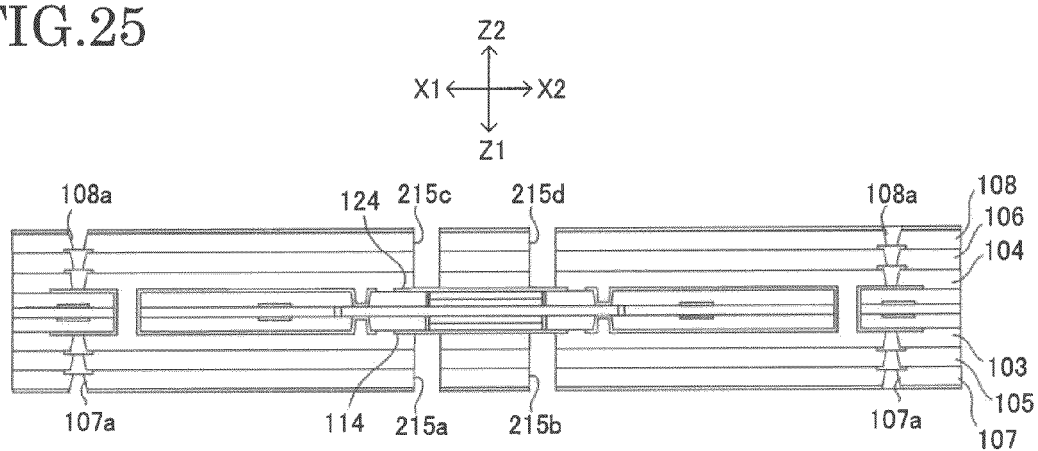
FIG. 25 is a view to illustrate a first step for forming a space to allow a flexible wiring board to bend.

Then, as shown in FIG. 25, via holes (107a, 108a) are formed and lines (215a-215d) are cut by using a laser, for example. After that, desmearing is conducted on via holes (107a, 108a), if required. Via hole (107a) is formed in insulation layer 107, and via hole (108a) is formed in insulation layer 108. Cut lines (215a, 215b) are formed in insulation layers (103, 105, 107), and cut lines (215c, 215d) are formed in insulation layers (104, 106, 108). During that time, conductive patterns (114, 124) may be used as a stopper, for example. Also, by adjusting the irradiation energy or irradiation time of the laser, conductive patterns (114, 124) may be cut to a certain degree.

Figure 26:
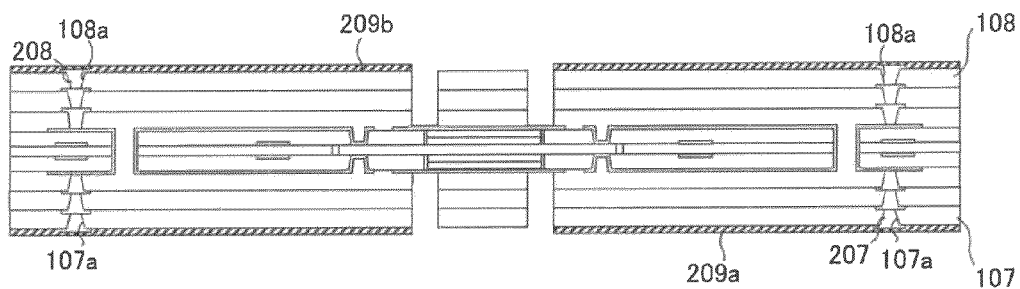
FIG. 26 is a view to illustrate a second step for forming a space to allow a flexible wiring board to bend.

Next, as shown in FIG. 26, for example, conductors (207, 208) are formed after conducting PN plating (such as chemical copper plating and copper electroplating) and a lithographic process. Also, solder-resist layers (209a, 209b) are formed on the surfaces of the wiring board by screen printing or lamination, for example. After that, by adding heat, solder-resist layers (209a, 209b) are cured. Also, patterning, boring and exterior processing are conducted, if required.

Figure 27:
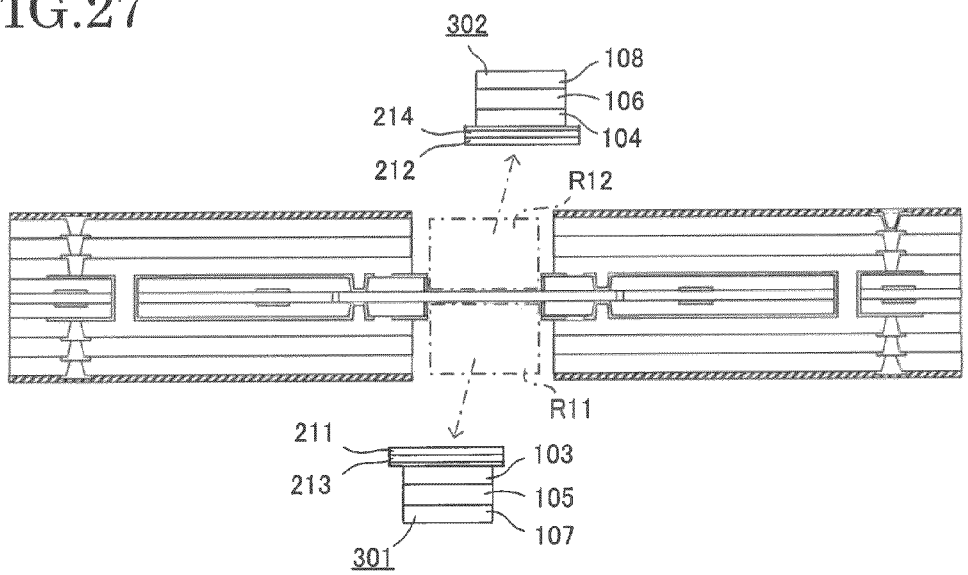
FIG. 27 is a view to illustrate a third step for forming a space to allow a flexible wiring board to bend.

Then, as shown in FIG. 27, for example, structures (301, 302) are removed by peeling them from flexible wiring board 13. At that time, detachment is easy, since first separators (211, 212) are arranged. In doing so, the central section of flexible wiring board 13 is exposed, and spaces (regions (R11, R12) in FIG. 27) which allow flexible wiring board 13 to warp (bend) are formed on the upper and lower surfaces (in the lamination directions of insulation layers) of flexible wiring board 13. After that, if required, remaining conductors are removed by mask etching, for example.

Next, openings (210a, 210b) are formed in solder-resist layers (209a, 209b) using a photolithographic technique, for example. Then, by printing solder paste and reflowing, external connection terminals (207b, 208b) (solder bumps) are formed in openings (210a, 210b). Accordingly, flex-rigid wiring board 10 (FIG. 1) is completed. Also, according to requirements, external processing, warping correction, conductivity inspection, inspection of exterior appearance or final inspection is conducted.

In the wiring board and the manufacturing method of the present embodiment, conductors (21a, 22a) made of conductive paste are used, allowing a conductor in the flexible region and a conductor in the rigid region to be electrically connected to each other without using plating. Thus, plating solutions are not required, and the environmental load is reduced.

In the wiring board and the manufacturing method of the present embodiment, by means of conductors (21a, 22a), areas of power-source patterns may be formed smaller and signal noise may be reduced in flexible wiring board 13, whose area is small compared with the area of first rigid wiring board 11 or second rigid wiring board 12, and where signal lines (13a) (FIG. 2) tend to be concentrated. Accordingly, highly integrated signal wirings may be achieved on flexible wiring board 13. As a result, flex-rigid wiring board 10 may be made highly functional.

Moreover, according to the manufacturing method of the present embodiment, conductors (21a, 22a) may be formed through simplified procedures, making it advantageous from a viewpoint of reducing signal noise and costs.

So far, a flex-rigid wiring board and its manufacturing method according to the embodiment of the present invention have been described. However, the present invention is not limited to the above embodiment. For example, the present invention may also be carried out by being modified as follows.

Figure 28:
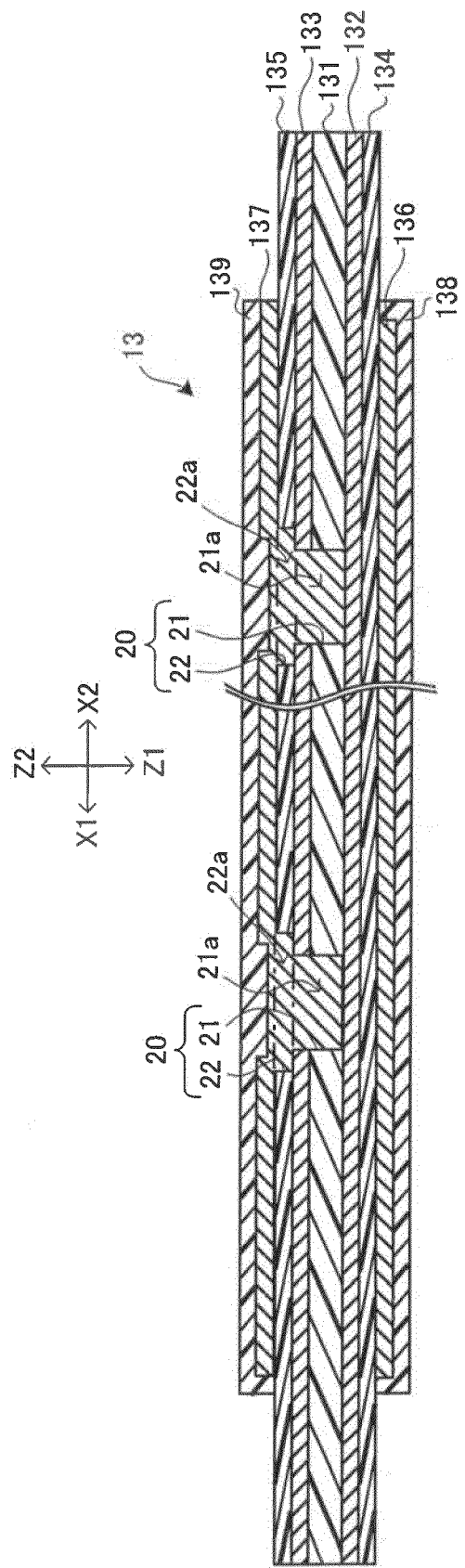
FIG. 28 is a view showing an example of a flexible wiring board having multiple conductive-pattern connection sections.

The number of holes 20 and conductors (21a, 22a) in one flexible wiring board 13 is not limited to one. For example, the number may be multiple (such as two) as shown in FIG. 28, for example.

Figure 29:
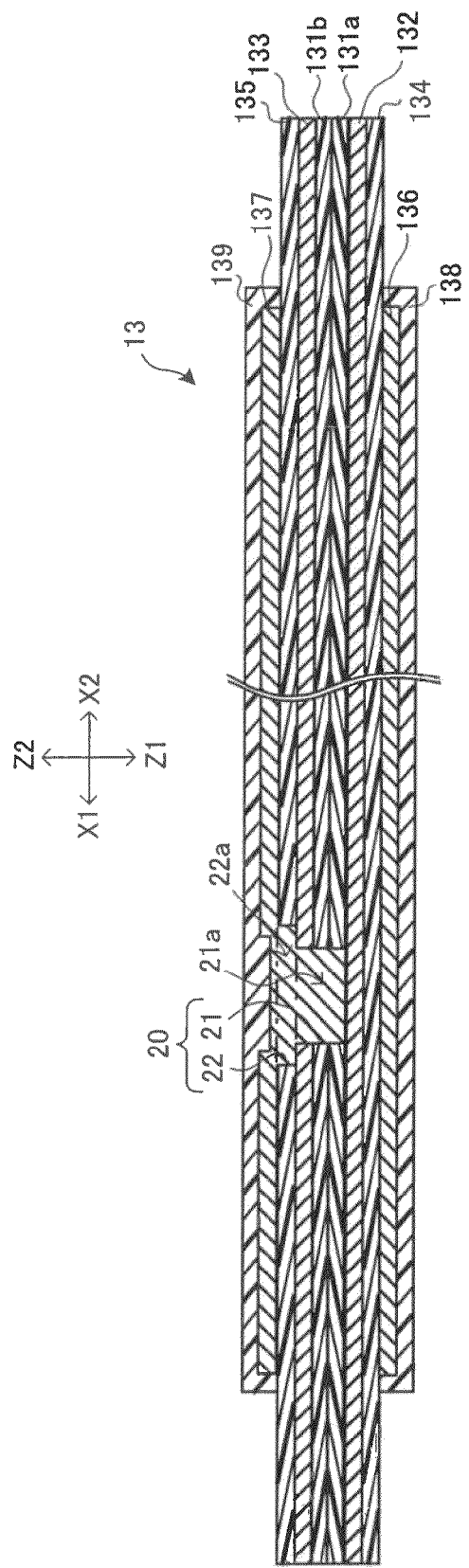
FIG. 29 is a view showing an example of a flexible wiring board having a multi-layer flexible substrate.

Flexible substrate 131 may be multilayered. For example, as shown in FIG. 29, flexible substrate 131 may also be structured with two layers; first flexible layer (131a) and second flexible layer (131b).

Figure 30A:
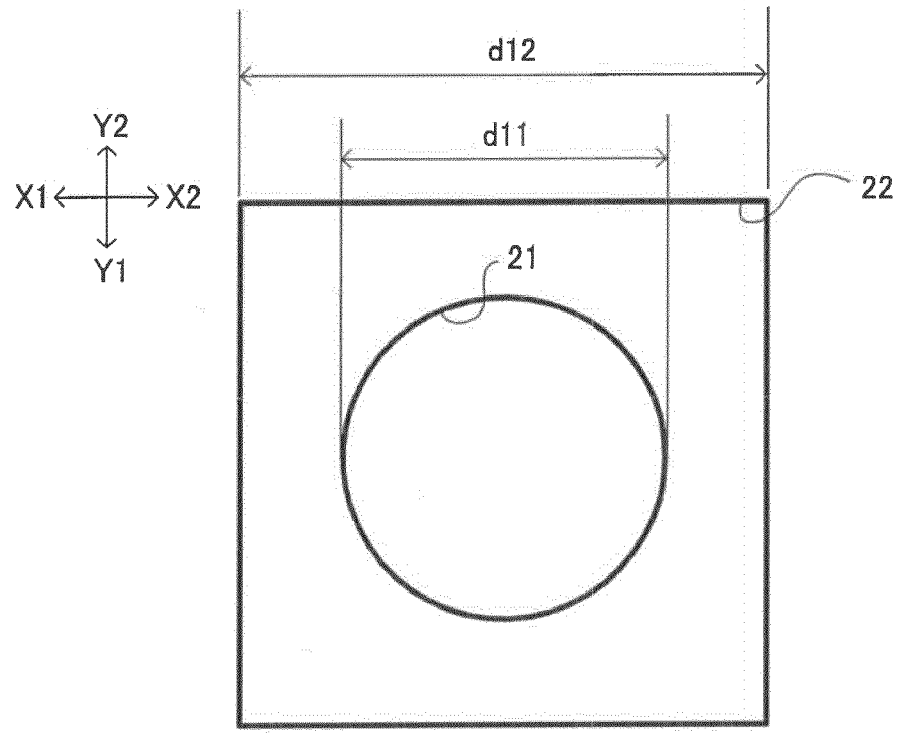
FIG. 30A is a view showing a first alternative example of a hole configuration in a conductive-pattern connection section of a flexible wiring board.
Figure 30B:
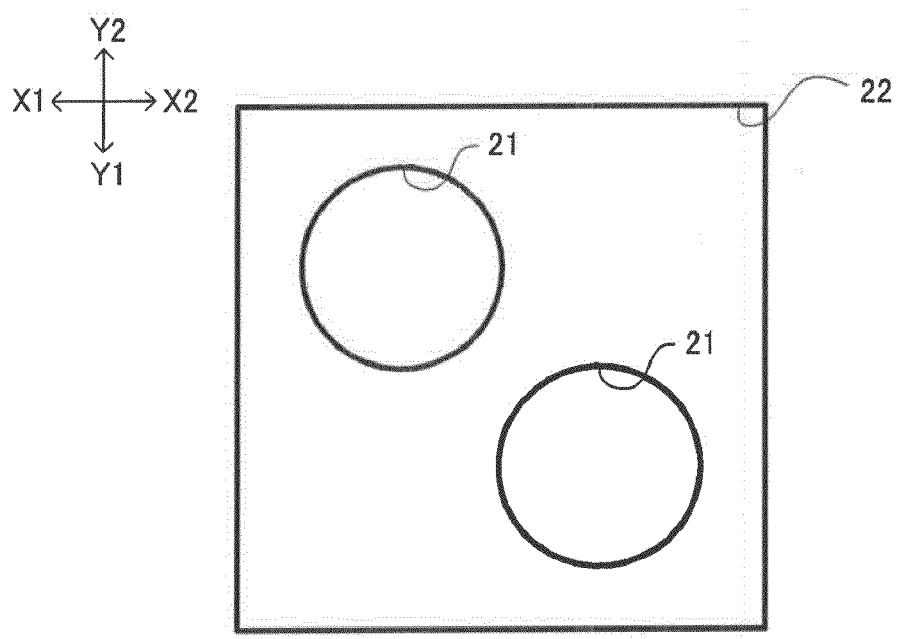
FIG. 30B is a view showing a second alternative example of a hole configuration in a conductive-pattern connection section of a flexible wiring board.

The opening of hole 20 is not limited to any specific shape. For example, as shown in FIG. 30A, first hole 21 and second hole 22 may have different shapes (such as circular or four-sided). Alternatively, as shown in FIG. 30B, for example, multiple (such as two) first holes 21 may be formed in second hole 22.

Figure 31:
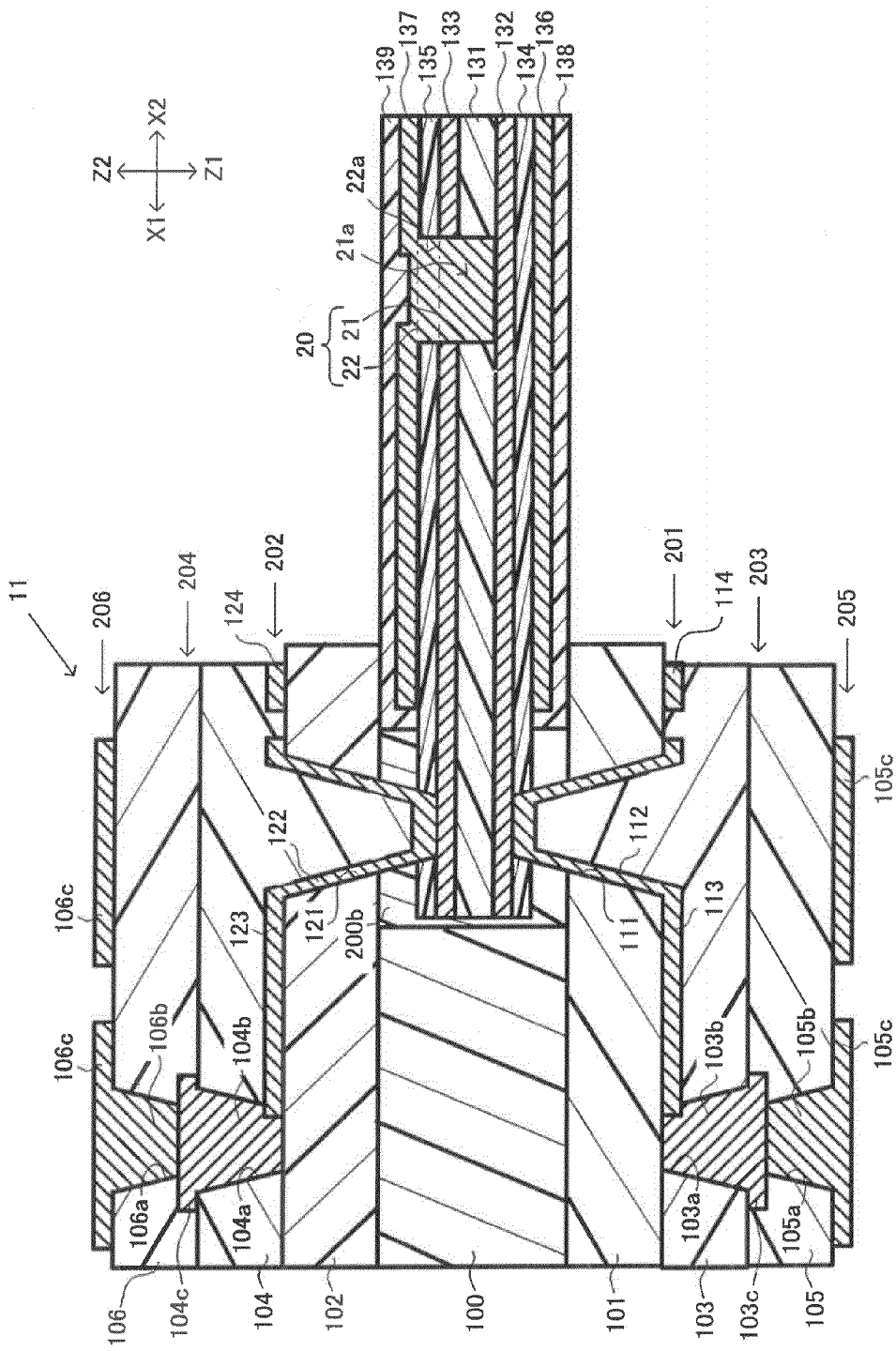
FIG. 31 is a view showing an example of a flex-rigid wiring board in which a hole is shaped to be straight in a conductive-pattern connection section of the flexible wiring board.

It is not always required that diameter (d12) of second hole 22 be greater than diameter (d11) of first hole 21. For example, as shown in FIG. 31, hole 20 may also be a straight hole. In such a case, first hole 21 and second hole 22 have the same diameter.

Figure 32:
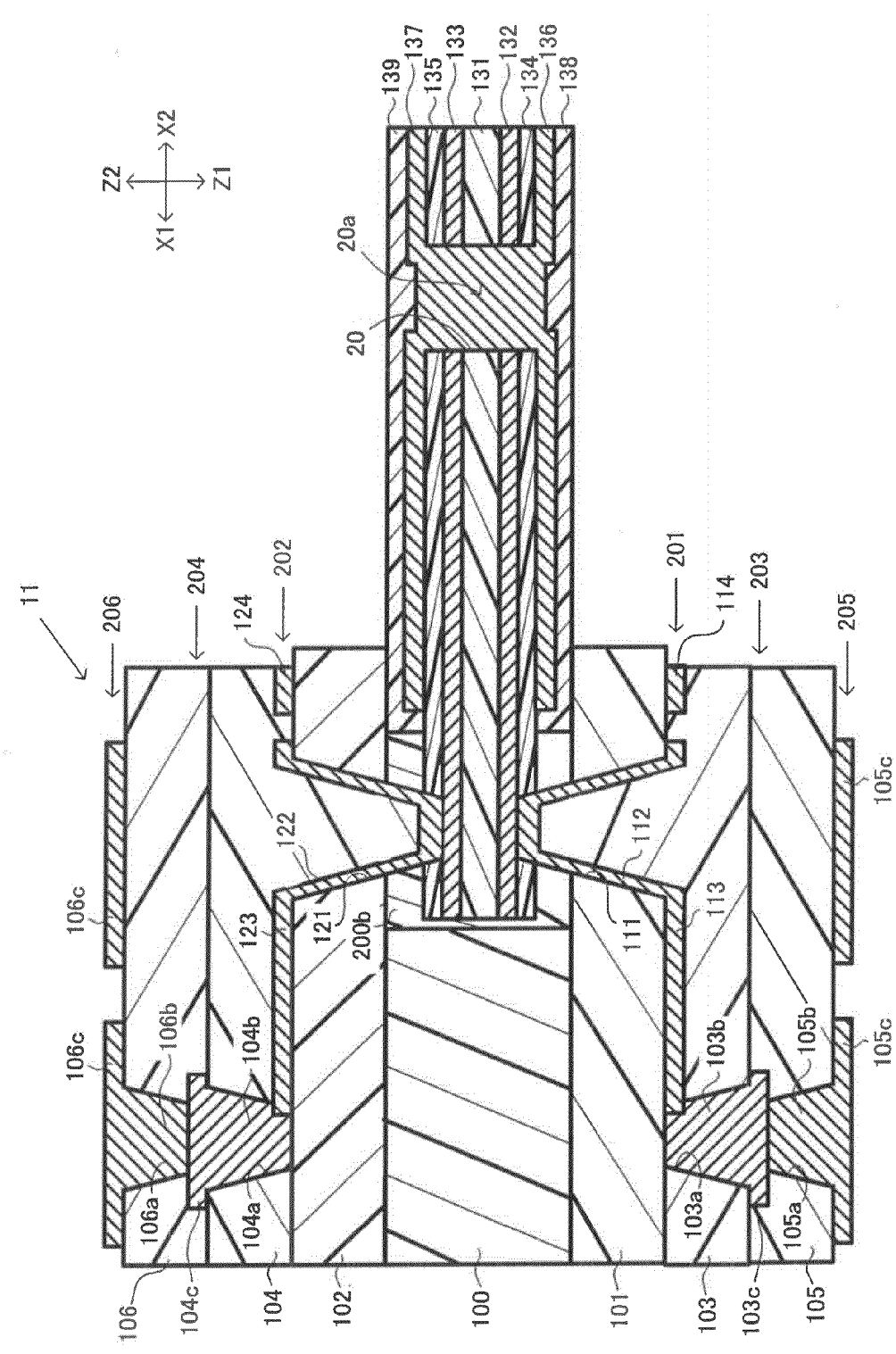
FIG. 32 is a view showing an example of a flex-rigid wiring board in which a conductor in a conductive-pattern connection section of the flexible wiring board is formed to be contiguous to a shield layer on both surfaces.

As shown in FIG. 32, hole 20 may also be formed to penetrate insulation layer 135, conductive layer 133, flexible substrate 131, conductive layer 132 and insulation layer 134 so that conductor (20a) in hole 20 will be formed to be contiguous to shield layers (136, 137) on both surfaces.

Figure 33:
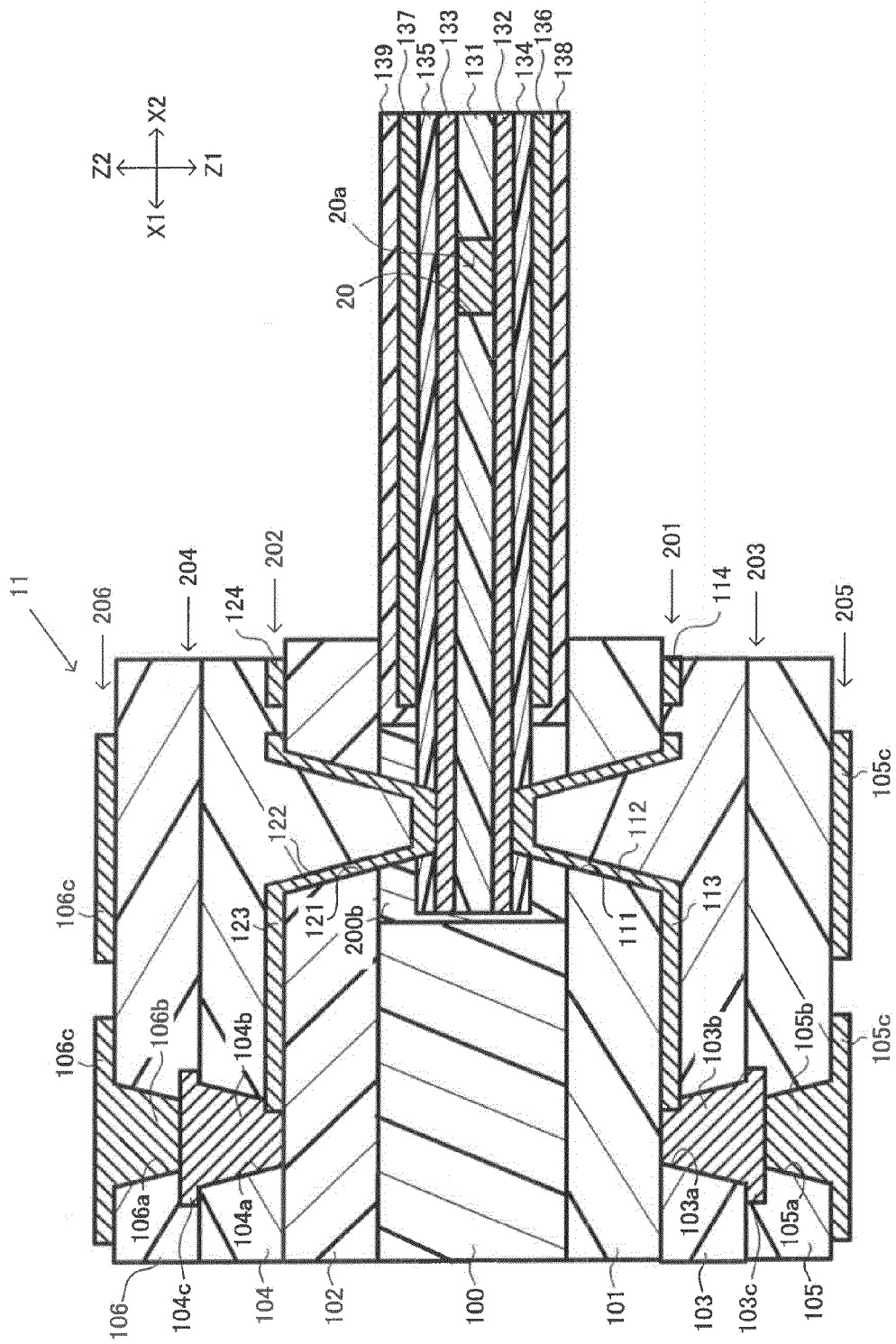
FIG. 33 is a view showing an example of a flex-rigid wiring board in which a hole in a conductive-pattern connection section of the flexible wiring board penetrates only the flexible substrate.
Figure 34:
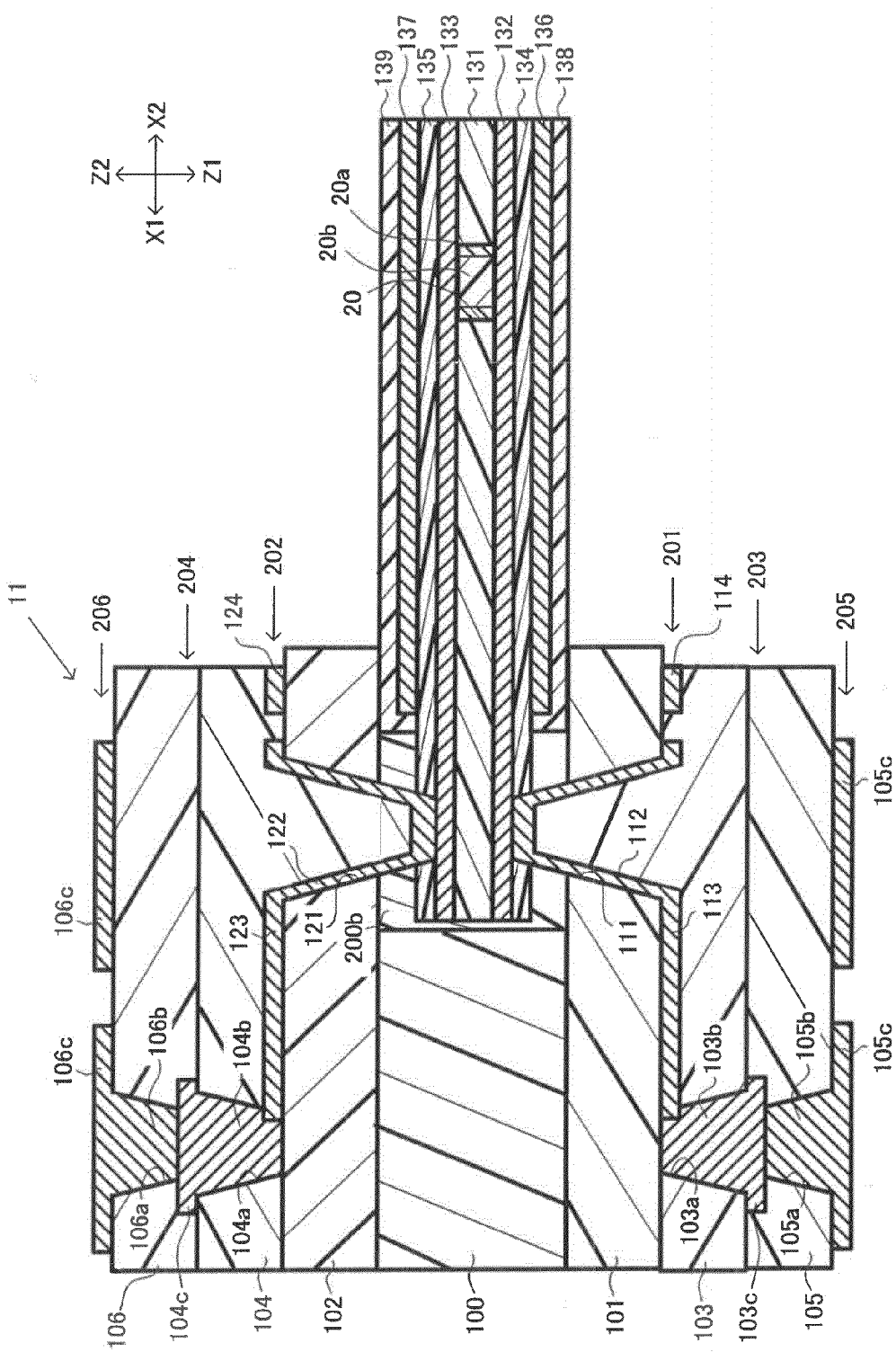
FIG. 34 is a view showing an example of a flex-rigid wiring board in which a conductor in a conductive-pattern connection section of the flexible wiring board is formed only on the wall surface of a hole.

It is not always required that conductor (20a) in hole 20 be formed to be contiguous to shield layers (136, 137). For example, as shown in FIG. 33, by forming hole 20 penetrating only flexible substrate 131, conductor (20a) in hole 20 may be used to electrically connect conductive layer 132 and conductive layer 133 to each other. Alternatively, conductor (20a) may be made of a different material from that of shield layers (136, 137). Yet alternatively, conductor (20a) may not be electrically connected to shield layers (136, 137). Furthermore, it is not always required that conductor (20a) be filled in hole 20. For example, as shown in FIG. 34, conductor (20a) may be formed only on the wall surface of hole 20. In such a case, insulative body (20b), for example, is filled in the inner side of conductor (20a). In such a case as well, by using conductor (20a) made of conductive paste, a reduction in the environmental load may be maintained.

Regarding other factors, the structures of first rigid wiring board 11, second rigid wiring board 12 and flexible wiring board 13 or the like in flex-rigid wiring board 10 may be modified freely within a scope that does not deviate from the gist of the present invention.

Figure 35:
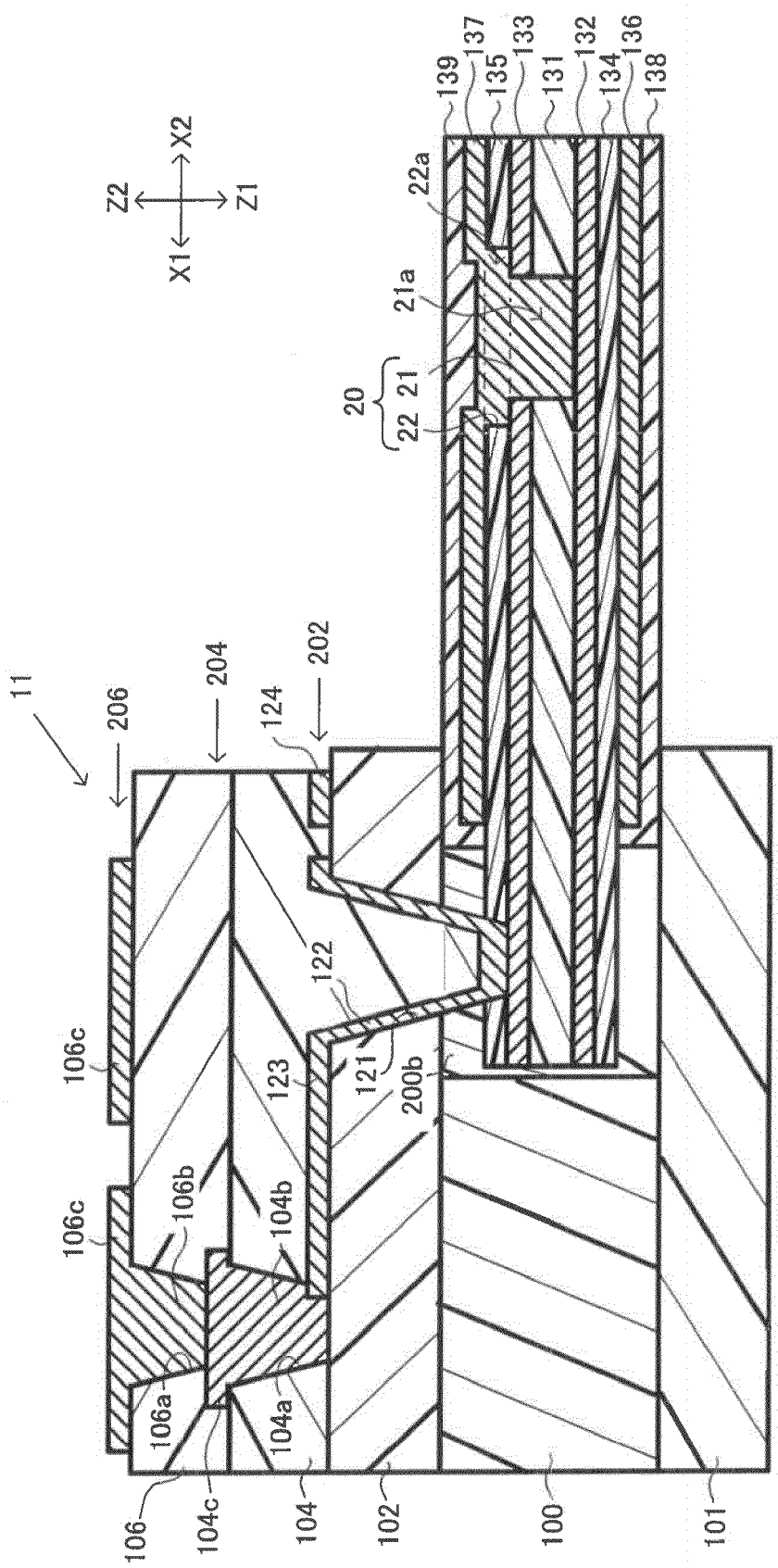
FIG. 35 is a view showing an example of a single-sided wiring board.

First rigid wiring board 11 and second rigid wiring board 12 may be single-sided wiring boards having conductors (wiring layers) only on either the upper or lower surface of the core as shown in FIG. 35, for example.

Figure 36:
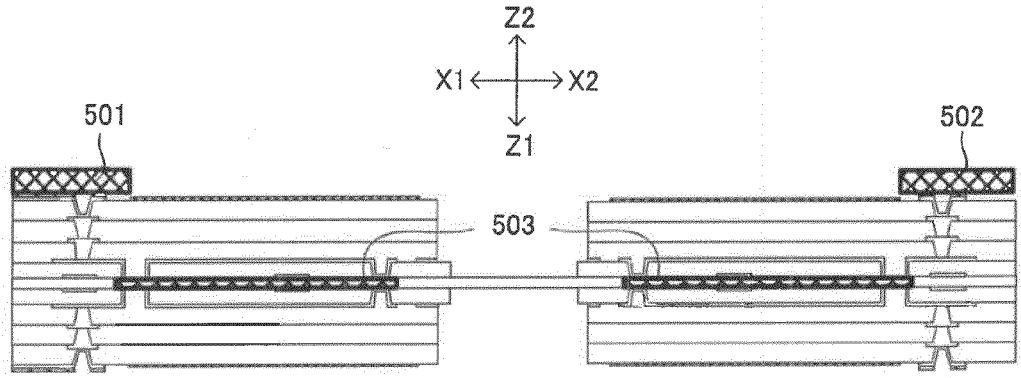
FIG. 36 is a view showing an example of a flex-rigid wiring board having electronic components.

Flex-rigid wiring board 10 may have electronic components (501, 502) mounted on its surface, or electronic component 503 built in, as shown in FIG. 36, for example.

Connecting first rigid wiring board 11 and second rigid wiring board 12 is not limited to any specific method. For example, wire bonding and flip-chip bonding may also be employed.

Figure 37:
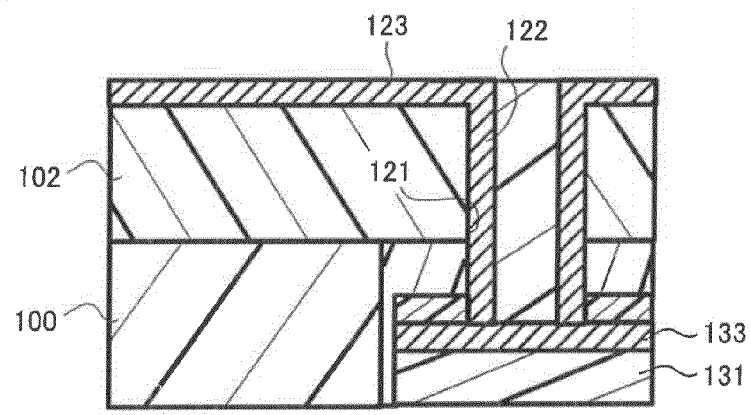
FIG. 37 is a view showing an example of an interlayer connection conductor formed in a through hole.
Figure 38:
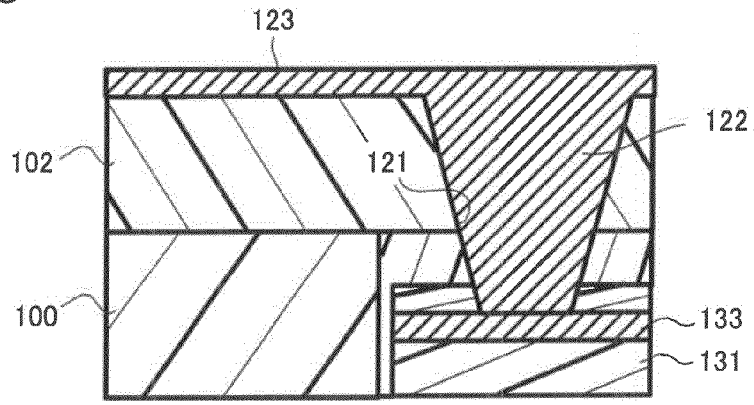
FIG. 38 is a view showing an example of an interlayer connection conductor formed as a filled via.

The interlayer connection conductors used in flex-rigid wiring board 10 is not limited to any specific kind. For example, as shown in FIG. 37, conductors 122 and others may be connected by a through hole. However, if such a structure is taken, an impact from being dropped or the like will concentrate on inner-wall portions of a through hole, and cracks may tend to occur in shoulder portions of the through hole, compared with cases using a conformal via. Alternatively, as shown in FIG. 38, for example, by filling conductor 122 in via hole 121, both wiring boards may be connected through a filled via. In such a structure, areas receiving the impact from being dropped or the like will become the entire via, and cracks will seldom occur, compared with cases using a conformal via. Furthermore, conductive resin may also be filled in a conformal via or a through hole.

Figure 39:
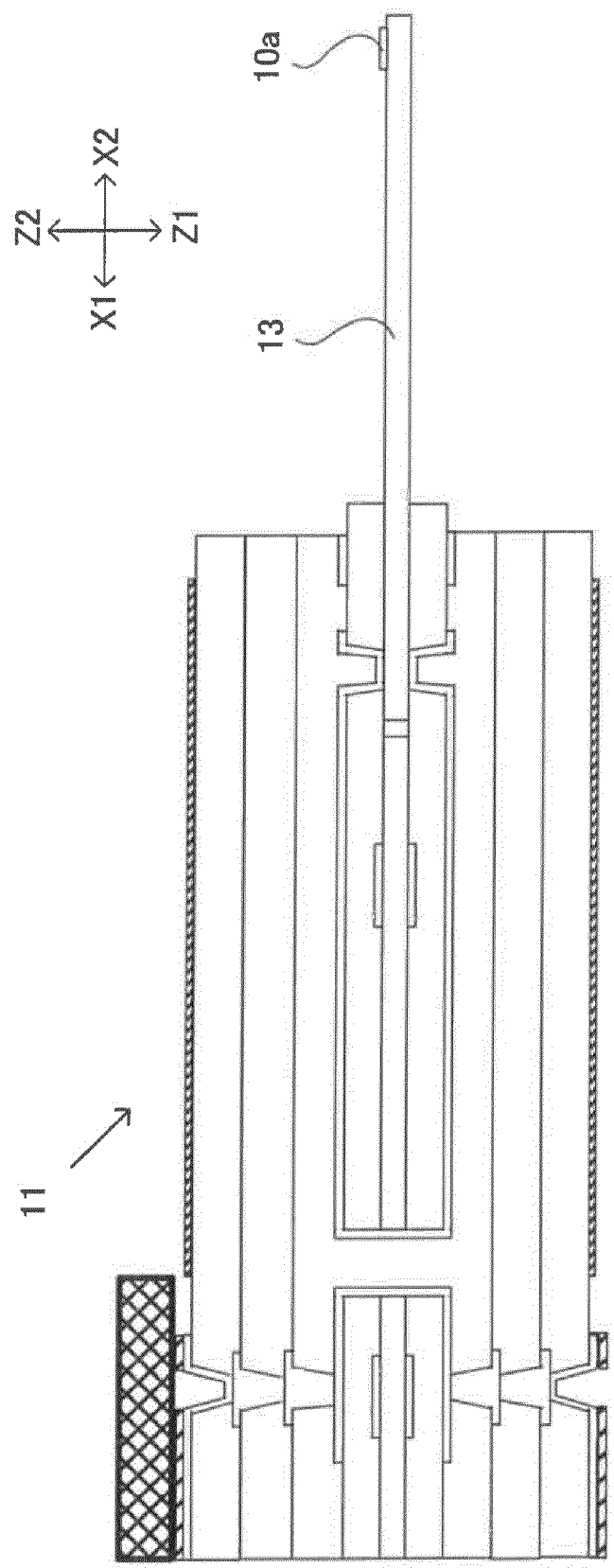
FIG. 39 is a view showing an example of a flying-tail structure.

Three or more rigid wiring boards may be connected to flexible wiring board 13. Alternatively, as shown in FIG. 39, a so-called flying-tail structure may be employed, for example, by omitting second wiring board 12, and making flexible wiring board 13 to protrude like a tail from first rigid wiring board 11. In a case shown in FIG. 39, part of an inner-layer pattern is extended from first rigid wiring board 11 to form terminal (10a) at an end of flexible wiring board 13. Another wiring board or device may be electrically connected by such terminal (10a).

The contents and the order of the steps in the above embodiment may be modified within a scope that does not deviate from the gist of the present invention. Also, some steps may be omitted according to requirements.

Obviously, numerous modifications and variations of the present invention are possible in light of the above teachings. It is therefore to be understood that within the scope of the appended claims, the invention may be practiced otherwise than as specifically described herein.

What is claimed is:

1. A flex-rigid wiring board, comprising:
   a flexible substrate having a first surface and a second surface on an opposite side of the first surface;
   a first conductive pattern formed on the first surface of the flexible substrate;
   a second conductive pattern formed on the second surface of the flexible substrate;
   an insulation layer formed on at least one of the first conductive pattern and the second conductive pattern; and
   a conductor made of a conductive paste and formed in a first hole penetrating through the flexible substrate such that the first conductive pattern and the second conductive pattern are electrically connected to each other,
   wherein the insulation layer has a second hole with a diameter which is greater than a diameter of the first hole, and the second hole is connected to the first hole.

2. The flex-rigid wiring board according to claim 1, further comprising a shield layer formed as an upper layer of at least one of the first conductive pattern and the second conductive pattern, wherein the shield layer is made of the conductive paste of the conductor.

3. The flex-rigid wiring board according to claim 1, further comprising a shield layer formed as an upper layer of at least one of the first conductive pattern and the second conductive pattern, wherein the shield layer is electrically connected to the conductor.

4. The flex-rigid wiring board according to claim 1, wherein the first hole has an end which is open and the other end which is blocked.

5. The flex-rigid wiring board according to claim 1, wherein the conductive paste contains at least one of silver, gold, copper and carbon.

6. The flex-rigid wiring board according to claim 1, wherein at least one of the first conductive pattern and the second conductive pattern is set as ground.

7. The flex-rigid wiring board according to claim 1, wherein the flexible substrate is made multilayered.

8. A flex-rigid wiring board, comprising:
   a flexible substrate having a first surface and a second surface on an opposite side of the first surface;
   a first conductive pattern formed on the first surface of the flexible substrate;
   a second conductive pattern formed on the second surface of the flexible substrate;
   an insulation layer formed on the second conductive pattern;
   a shield layer formed on the insulation layer; and
   a conductor made of a conductive paste and formed in a hole penetrating through the insulating layer, the second conductive pattern and the flexible substrate and reaching the first conductive pattern such that the first conductive pattern and the second conductive pattern are electrically connected to each other.

9. The flex-rigid wiring board according to claim 8, wherein the conductor is filling the hole.

10. The flex-rigid wiring board according to claim 8, wherein the conductor is formed such that the conductor is contiguous to the shield layer.

11. The flex-rigid wiring board according to claim 8, further comprising an upper-layer insulation layer formed on the insulation layer.

12. A method for manufacturing a flex-rigid wiring board, comprising:
    providing a flexible substrate having a first surface and a second surface on an opposite side of the first surface;
    forming a first conductive pattern on the first surface of the flexible substrate;
    forming a second conductive pattern on the second surface of the flexible substrate;
    forming a first hole penetrating the second conductive pattern and the flexible substrate;
    forming a conductor made of conductive paste in the first hole such that the first conductive pattern and the second conductive pattern are electrically connected to each other
    forming an insulation layer formed on at least one of the first conductive pattern and the second conductive pattern; and
    forming a second hole with a diameter which is greater than a diameter of the first hole in the insulation layer such that the second hole is connected to the first hole.

13. The method for manufacturing a flex-rigid wiring board according to claim 12, further comprising forming a shield layer as an upper layer of at least one of the first conductive pattern and the second conductive pattern, wherein the shield layer is made of the conductive paste of the conductor.

14. The method for manufacturing a flex-rigid wiring board according to claim 12, further comprising forming a shield layer as an upper layer of at least one of the first conductive pattern and the second conductive pattern, wherein the shield layer is electrically connected to the conductor.

15. The method for manufacturing a flex-rigid wiring board according to claim 12, wherein the forming of the first hole comprises forming the first hole having an end which is open and the other end which is blocked.

16. The method for manufacturing a flex-rigid wiring board according to claim 12, wherein the conductive paste contains at least one of silver, gold, copper and carbon.

17. The method for manufacturing a flex-rigid wiring board according to claim 12, further comprising setting at least one of the first conductive pattern and the second conductive pattern as ground.

18. The method for manufacturing a flex-rigid wiring board according to claim 12, wherein the forming of the flexible substrate comprises forming the flexible substrate having a multilayered structure.

* * * * *